US005802075A

United States Patent [19]

Carpenter et al.

[11] Patent Number: 5,802,075
[45] Date of Patent: Sep. 1, 1998

[54] DISTRIBUTED TEST PATTERN GENERATION

[75] Inventors: Shawn R. Carpenter, Minneapolis; Samuel J. Lewis, Andover, both of Minn.

[73] Assignee: Unisys Corporation, Blue Bell, Pa.

[21] Appl. No.: 783,344

[22] Filed: Jan. 16, 1997

[51] Int. Cl.$^6$ .................................................... G06F 11/00
[52] U.S. Cl. ................................... 371/27.1; 371/22.31
[58] Field of Search ......................... 371/27.1, 22.31, 371/22.32, 22.33, 22.34; 395/183.06

[56] References Cited

U.S. PATENT DOCUMENTS

| | | | |
|---|---|---|---|
| 4,758,953 | 7/1988 | Morita et al. | 364/300 |
| 4,831,543 | 5/1989 | Mastellone | 364/489 |
| 4,918,614 | 4/1990 | Modarres et al. | 364/490 |
| 5,050,091 | 9/1991 | Rubin | 364/488 |
| 5,164,908 | 11/1992 | Igarashi | 364/491 |
| 5,175,696 | 12/1992 | Hopper et al. | 364/489 |
| 5,222,029 | 6/1993 | Hopper et al. | 364/489 |
| 5,255,363 | 10/1993 | Seyler | 395/164 |
| 5,267,175 | 11/1993 | Hopper | 364/489 |
| 5,341,309 | 8/1994 | Kawata | 364/489 |
| 5,349,659 | 9/1994 | Do et al. | 395/700 |
| 5,355,317 | 10/1994 | Talbott et al. | 384/468 |
| 5,357,440 | 10/1994 | Talbott et al. | 364/467 |
| 5,359,523 | 10/1994 | Talbott et al. | 364/468 |
| 5,359,537 | 10/1994 | Saucier et al. | 364/489 |
| 5,361,357 | 11/1994 | Kionka | 395/700 |
| 5,398,195 | 3/1995 | Kim | 364/491 |
| 5,406,497 | 4/1995 | Altheimer et al. | 364/489 |
| 5,416,721 | 5/1995 | Nishiyama et al. | 364/491 |
| 5,418,733 | 5/1995 | Kamijima | 364/490 |
| 5,418,954 | 5/1995 | Petrus | 395/700 |
| 5,440,720 | 8/1995 | Baisuck et al. | 395/500 |
| 5,483,461 | 1/1996 | Lee et al. | 364/490 |
| 5,485,396 | 1/1996 | Brasen et al. | 364/491 |
| 5,490,266 | 2/1996 | Sturges | 395/500 |
| 5,490,268 | 2/1996 | Matsunaga | 395/550 |
| 5,491,640 | 2/1996 | Sharma et al. | 364/488 |
| 5,493,508 | 2/1996 | Dangelo et al. | 364/489 |

*Primary Examiner*—Vincent P. Canney
*Attorney, Agent, or Firm*—Nawrocki, Rooney & Sivertson, P.A.

[57] ABSTRACT

A method and apparatus for automatically generating test patterns for a circuit design using a number of data processing elements. The present invention reduces the wall time required to generate the test patterns for the overall circuit design by partitioning the design into a number of partitions, distributing the partitions to a number of data processing elements, and generating test patterns for each partition on the corresponding data processing elements. The present invention automatically assembles the resulting local test patterns to reflect the scan structure of the overall circuit design.

38 Claims, 20 Drawing Sheets

PRIOR ART

DISTRIBUTED TEST PATTERN GENERATION

CROSS REFERENCE TO CO-PENDING APPLICATIONS

The present application is related to U.S. patent application Ser. No. 08/524,017, filed Aug. 29, 1995, entitled "A Method of Stabilizing Component and Net Names of Integrated Circuits In Electronic Design Automation Systems", which is assigned to the assignee of the present invention and incorporated herein by reference.

BACKGROUND OF THE INVENTION

1. Field of the Invention

This invention relates generally to electronic design automation (EDA) systems used for designing electric circuits, and more particularly relates to the automatic generation of test patterns for an electric circuit.

2. Description of the Prior Art

The advancement of integrated circuit, printed circuit board and other related technologies is progressing at a very rapid rate. The latest generation of integrated circuits can incorporate over four times the circuitry than was possible just a few years ago. Further, circuit board and multi-chip module technology has allowed much denser circuit board designs. These and other advancements have allowed the development of increasingly complex and high speed computer systems.

To maximize performance and minimize the size and power of such computer system, designers often implement much of the hardware in a number of integrated circuits. For maximum performance, the integrated circuits are often custom or semi-custom designed. Each integrated circuit may contain several hundred thousand gates, and each gate must be placed and routed in accordance with an overall computer system specification, all on a die typically measuring less than 625 mils on a side. This "integration" of computer system hardware has a number of advantages, including increased performance, lower power, more reliability, and a reduced cost.

A difficulty with the integration of system hardware is that an increasing number of nodes within the system are neither controllable or observable from external pins. Because the test patterns for a circuit design, as applied by a tester or the like, can only be applied to external pins, the fault coverage of the test patterns may be limited. The fault coverage identifies the number of tested nodes divided by the number of total nodes in the circuit design. Although not always possible or practical, the fault coverage of a test pattern set should approach 99%.

One method for improving the testability of modern circuit designs is to incorporate scan strings or other test structures within the design. When using a scan methodology, selected functional registers within the design are enhanced to also be serial scan shift registers. The serial scan shift registers are then interconnected to form a number of serial scan strings.

During normal functional operations, the serial scan shift registers are placed in functional mode and operate like any other flip-flop. In test mode, the serial scan shift registers are configured into a scan path which allows test data to be "serially shifted" through the registers within the design.

Typically, Automatic Test Equipment (ATE) scans in computer generated serial scan test patterns through the serial scan shift registers within the design. Once these patterns are fully shifted into the design, the data residing in the serial scan shift registers travels through the logic gates and eventually arrives at either an I/O pin or another serial scan shift register. The serial scan shift registers are then switched into functional mode and the functional clock is pulsed once. The functional clock causes the serial scan shift registers to capture the data that has traveled through the logic gates. The serial scan shift registers are then switched back into test mode and the results are shifted out and compared to an expected value. This process is repeated until an adequate fault coverage is obtained. As can readily be seen, the addition of serial scan shift registers may make selected nodes within a design both controllable and observable, and may increase the fault coverage that can be achieved for a particular circuit design.

The generation of test patterns for modern circuit designs can be difficult and time consuming. Because large circuit designs may have a million nodes or more, manual generation of such test patterns is not practical. Automatic Test Pattern Generations (ATPG) programs have been developed to help generate the test patterns. ATPG programs typically read the circuit design, including the logic simulation models therefor, and generate either parallel or serial test patterns. The ATPG programs also typically provide the user with the fault coverage of a particular test pattern set. These programs have been instrumental in the generation of test pattern sets for complex designs.

A limitation of the above-described ATPG test programs is that they typically operate on a single engineering workstation. It has been observed that for many of todays large circuit designs, the ATPG programs may require many days of wall time to generate an adequate set of test patterns. The wall time for generating test vectors is known to be exponential with respect to the number of gates in the circuit under test. To help reduce the processing time required by the ATPG programs, circuit designers may attempt to manually partition a circuit design into a number of smaller blocks, or partitions. These partitions may then be provided to a number of engineering workstations, wherein a number of copies of the ATPG program may be used to generate test patterns for each of the partitions in a parallel fashion.

It has been recognized, however, that this approach may suffer from a number of limitations, some of which are described below. First, the circuit designer typically must manually divide the overall circuit design into the number of partitions, and must provide each of the partitions to a selected workstation. Second, the circuit designer must typically execute each run on each workstation. These tasks can be time consuming and tedious.

Third, each of the separate ATPG programs typically only generate test patterns for the corresponding partition. Thus, the individual ATPG programs may only produce test patterns that can be provided to the partition, and not to the overall circuit design. For example, assuming that a given partition includes four flip-flops that are connected to form a scan string, the ATPG program may erroneously believe that the four flip-flops form an entire scan string. In reality, the four flip-flops may only be a small part of a much larger scan string that may cross several partition boundaries. Thus, when the ATPG program generates a test pattern involving these four flip-flops, the resulting scan test pattern may reflect the ATPG program's erroneous view of the overall scan structure. To overcome these limitations, circuit designer typically must manually combine and update the resulting scan string and bit position data provided by the number of workstations to reflect the overall scan structure of the circuit design. This task is time consuming and error-prone, particular for modern circuit designs that can require thousands of test vectors to achieve an adequate fault coverage.

SUMMARY OF THE INVENTION

The present invention overcomes many of the disadvantages of the prior art by providing a method and apparatus for automatically generating test patterns for a circuit design using a number of data processing elements. The present invention can reduce the wall time required to generate the test patterns for a circuit design by partitioning the circuit design into a number of partitions, distributing the partitions to a number of data processing elements, and generating test patterns for each partition on the corresponding data processing elements. The present invention also automatically assembles the resulting local test patterns generated for each of the partitions to reflect the scan structure of the overall circuit design. It also assembles the local fault lists generated for each partition to reflect the overall fault coverage number.

In an exemplary embodiment, one of the data processing elements is selected as the master data processing element. The remaining data processing elements may be considered slave data processing elements. The master data processing element may partition the circuit design into a number of partitions. Each of the resulting partitions, along with the list of possible stuck-at faults for a partition, may be assigned to a particular one of the data processing elements (either the master or one of the slaves). Each of the data processing elements may then generate a number of local test patterns and calculate the fault coverage therefore. The local test patterns and fault coverage list may then be transferred to the master data processing element, where the cumulative set of local test patterns may be merged to form a final test pattern set. Further, the cumulative set of fault lists may be merged to form a final fault coverage report.

It is contemplated that the local test patterns may be first merged by the slave data processing element to provide a reduced set of merged local test patterns before the local test patterns are provided to the master data processing element. This may reduce the number of local test patterns that must be transferred to the master data processing element. In either case, it is desirable for the master data processing element to merge the cumulative set of local test patterns to provided the final test pattern set.

To aid in the merging process, it is contemplated that the master data processing element may provide a master scan path list to each of the slave data processing elements. The master scan path list may identify the serial scan strings within the overall circuit design, and the corresponding scan bit positions of each scan register within the scan strings. The master data processing element may also identify the I/O pins of the overall circuit design. In this way, the master data processing element provides each of the slave data processing elements with information that defines the scan paths and I/O pins for the overall circuit design. Each of the slave data processing elements may identify the scan registers unique to each partition, and by using this information from the master data processing element, may identify the relative position of those scan registers relative to the overall scan paths.

For each local test pattern, the corresponding slave data processing elements may provide a starting test pattern having a number of temporary test bits. Each of the starting test bits corresponds to one of the number of scan bits and I/O pins identified in the master scan path and I/O list. Thus, the starting test pattern may have a bit width that equals the total number of scan bits in the scan paths of the overall design plus the number I/O pins in the overall design. Initially, the starting test bits may be set to a don't care value (e.g. "X").

Thereafter, and in a preferred embodiment, the slave data processing elements may use an ATPG software program to generate initial local test patterns. The number of test bits in the initial local test patterns may corresponds to the number of registers and/or I/O pins that are set to a value to test the desired logic. For example, for a partition that includes four scan registers, the initial local test pattern may include four bits if all register are set to test the logic therebetween. Once a first initial local test pattern is generated, the corresponding slave data processing element may identify the scan bit positions and I/O pins that correspond to the bits in the master scan path and I/O pins list. The correspondence may be identified by noting the instance names of the scan registers or I/O pins set by the first initial local test pattern, and then identifying the corresponding bit position in the overall scan paths or I/O pin by referencing the master scan path and I/O lists.

Thereafter, the slave data processing element may set the starting test bits that correspond to the scan bit positions and I/O pins of the first initial local test pattern to the corresponding values. The result is a first local test pattern, which has a bit width equal to the total number of scan bits in the overall circuit design plus the number of I/O pins in the overall circuit design.

After all of the local test patterns are generated, the local test patterns may be merged by simply comparing a first one of the local test patterns with a second one of the local test patterns. The first local test pattern may be merged with the second local test pattern if, for example, the bit positions that are set to a value other than a don't-care value do not overlap one another. For example, if a first local test pattern is " . . . XX001X0 . . . " and a second local test pattern is " . . . 10XXXXX . . . " then the "set" bit positions do not overlap. If the set bit positions do not overlap, the first and second local test patterns may be merged by simply replacing those bit positions in the first local test pattern with the set bit positions in the second local test pattern, or visa versa. Continuing with the above example, the first and second local test pattern could be merged to " . . . 10001X0 . . . ". It is recognized that this is only an exemplary merging technique, and that other merging technique may be used to even further reduce the number of local test patterns that must be transferred to the master data processing element.

Once the local test patterns are merged with one another, as described above, they are transferred to the master data processing element. The master data processing element may receive the local test patterns from all of the slave data processing elements, and in a preferred embodiment, may concatenate the local test patterns and store them in a single file. The master data processing element may then merge the cumulative set of local test patterns in a similar manner to that described above. The result may be a set of final test patterns which may be provided to automatic test equipment (ATE). Along with each local test pattern set, the slave data processing elements may provide a list of detected faults in a fault list. These fault lists are combined into a master fault list for the entire circuit.

It is contemplated that each of the slave data processing elements may include a partitioner for partitioning the corresponding partitions that are provided thereto. Alternatively, the master data processing element may perform all of the partitioning. In a preferred embodiment, the partitioner is a logic cone partitioner that partitions the logic into a number of logic cones. A logic cone may be defined as one or more paths that extend from at least one logic designer defined apex net to at least one logic designer defined base net affecting the apex net. For example, all logic extending from an input of a scan register back to either an output of another scan register or an I/O pin may be considered a logic cone, particularly since these nets are typically defined by the circuit designer. The cone partitioner may include a logic tracer for tracing the logic within the circuit design to help identify logic cones therein. A further discussion of partitioning logic into cones can be found in U.S. patent application Ser. No. 08/524,017, filed Aug. 29, 1995, entitled "A Method of Stabilizing Component and Net Names of Integrated Circuits In Electronic Design Automation Systems", which is incorporated herein by reference.

In a preferred embodiment of the present invention, the master and slave data processing elements are engineering workstations connected in a network configuration. The master engineering workstation includes control software which may control the overall test pattern generation process. As indicated above, the master engineering workstation preferably includes a partitioner program and a pattern merge program. The control program may include, at least in part, a commercially available network tool that allows the master engineering workstation to monitor the idle CPU time on the slave engineering workstations, invoke runs on the slave engineering workstations, and easily transfer data between workstations across the network. One such network tool is NetShare SDK, available from Aggregate Computing, Inc. NetShare and other equivalent network tools may allow the master workstation to select which workstations in the network to include as slave engineering workstations, and may allow the master engineering workstation to invoke the appropriate runs on the slave engineering workstations. In addition, each of the slave engineering workstations may include partitioner software (cone partitioner), an ATPG program, and a pattern merge program.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1A:
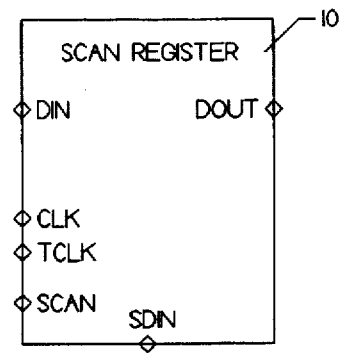
FIG. 1A is a symbolic representation of a typical serial scan shift register.

The detailed descriptions which follow are presented largely in terms of algorithms and symbolic representations of operations on data bits within a computer memory. These algorithmic descriptions and representations are the means used by those skilled in the data processing arts to most effectively convey the substance of their work to others skilled in the art.

An algorithm is here, generally, conceived to be a self-consistent sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers or the like. It should be kept in mind, however, that all of these and similar terms are to be associated with the appropriate physical quantities and are merely convenient labels applied to these quantities.

Furthermore, the manipulations performed are often referred to in terms, such as adding or comparing, which are commonly associated with mental operations performed by a human operator. No such capability of a human operator is necessary, or desirable in most cases, in any of the operations described herein which form part of the present invention; the operations are machine operations. Useful machines for performing the operations of the present invention include general purpose digital computers or other similar devices. In all cases, it should be kept in mind the distinction between the method operations in operating a computer and the method of computation itself. The present invention relates to method steps for operating a computer in processing electrical or other (e.g., mechanical, chemical) physical signals to generate other desired physical signals.

The present invention also relates to apparatus for performing these operations. This apparatus may be specially constructed for the required purposes or it may comprise a general purpose computer as selectively activated or reconfigured by a computer program stored in the computer. The algorithms presented herein are not inherently related to a particular computer system or other apparatus. In particular, various general purpose computer systems may be used with computer programs written in accordance with the teachings of the present invention, or it may prove more convenient to construct more specialized apparatus, to perform the required method steps. The required structure for such machines will be apparent from the description given below.

In sum, the present invention preferably is implemented for practice by a computer, e.g., a source code expression of the present invention is input to the computer to control operations therein. It is contemplated that a number of source code expressions, in one of many computer languages, could be utilized to implement the present invention. A variety of computer systems can be used to practice the present invention, including, for example, a personal computer, an engineering work station, an enterprise server, etc. The present invention, however, is not limited to practice on any one particular computer system, and the selection of a particular computer system can be made for many reasons.

FIG. 1A is a symbolic representation of a typical serial scan shift register. The scan register is generally shown at 10, and includes a data input port (DIN), a functional clock input (CLK) port, a test clock input (TCLK) port, a scan data input (SDIN) port and a scan mode control input (SCAN) port. The scan register 10 also includes a data output (DOUT) port.

Figure 1B:
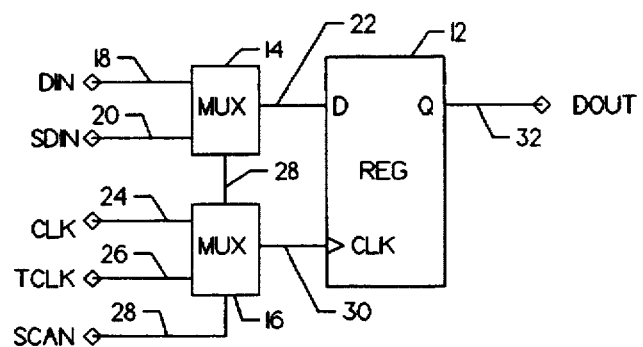
FIG. 1B is a schematic diagram of the serial scan shift register shown in FIG. 1A.

FIG. 1B, which shows an illustrative implementation for the scan register 10 of FIG. 1A. In the illustrative implementation, the scan register 10 includes a register 12, a first multiplexer 14 and a second multiplexer 16. The data input (DIN) port and the scan data input (SDIN) port are coupled to 2:1 multiplexer 14 via interfaces 18 and 20, respectively. The output of the 2:1 multiplexer 14 is coupled to the data input of register 12. The data input (DIN) port is the normal functional data input port for the scan register 10, and the scan data input (SDIN) port is the data input port when the scan register 10 is in test mode. Likewise, the functional clock input (CLK) port and the test clock input (TCLK) port are coupled to 2:1 multiplexer 16 via interfaces 24 and 26, respectively. The output of the 2:1 multiplexer 16 is coupled to the clock input of register 12. The functional clock input (CLK) port is the normal functional clock input port for scan register 10, and the test clock input (TCLK) port is the clock input port when the scan register 10 is in test mode.

Finally, the scan mode control input (SCAN) port is coupled to the select input of multiplexers 14 and 16, as shown. The scan mode control input (SCAN) port controls whether the scan register 10 is in functional mode or test mode. When in functional mode, the scan mode control input (SCAN) port is held low, causing multiplexers 14 and 16 to select the data input (DIN) port and the functional clock input (CLK) port, respectively, thereby providing these signals to the inputs of register 12. In contrast, and when in test mode, the scan mode control input (SCAN) port is held high, causing multiplexers 14 and 16 to select the scan data input (SDIN) port and the test clock input (TCLK) port, respectively, thereby providing these signals to the inputs of register 12. A further discussion of the operation of scan register 10 is provided below with reference to FIG. 2.

Figure 2:
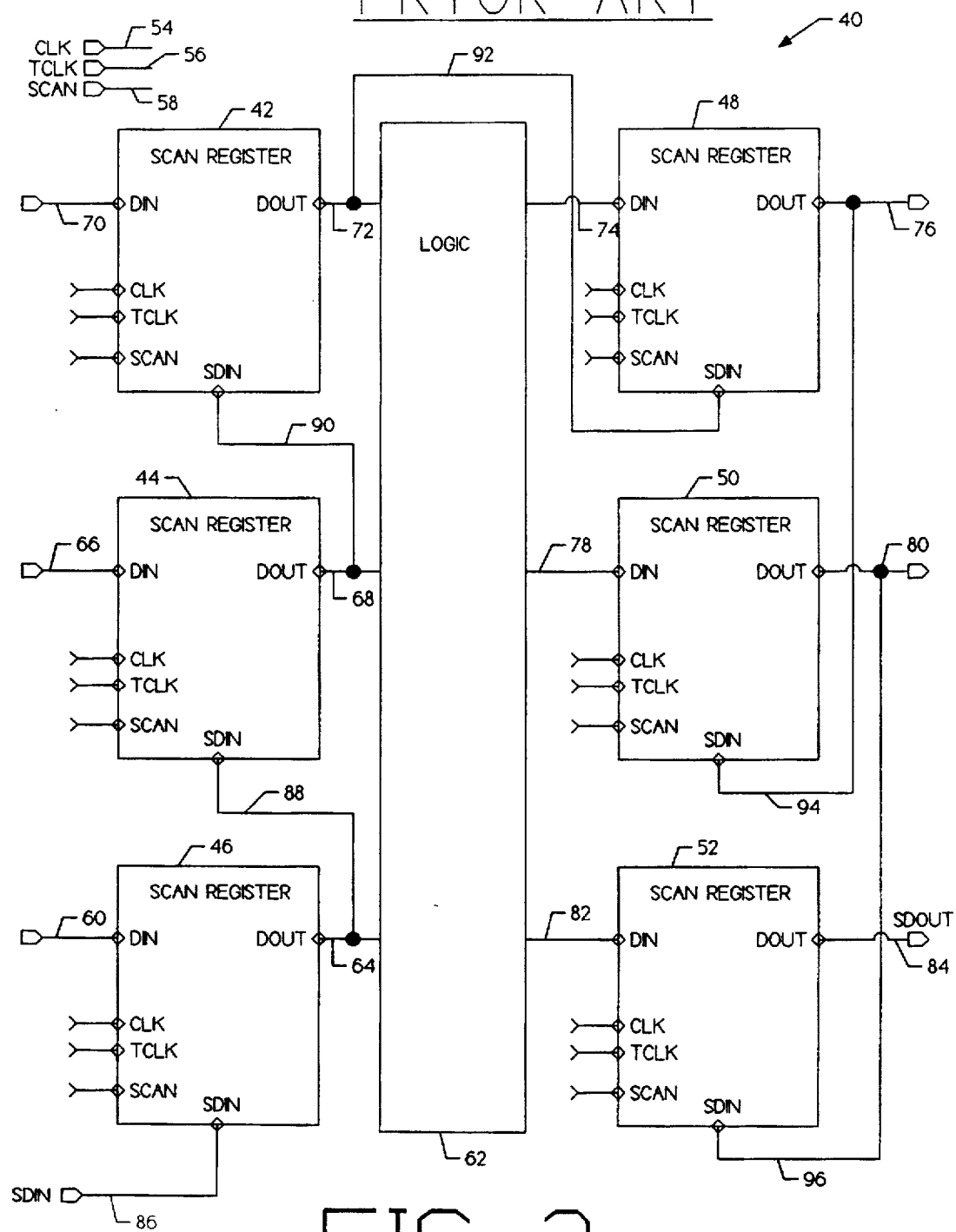
FIG. 2 is a schematic diagram of a typical scan path within an illustrative circuit design.

FIG. 2 is a schematic diagram of a typical scan path within an illustrative circuit design. The illustrative circuit design is generally shown at 40. A number of scan registers are shown, including scan registers 42, 44, 46, 48, 50, and 52. For convenience, the scan registers 42, 44, 46, 48, 50 and 52 are all shown implemented in accordance with FIG. 1B. Each of the scan registers 42, 44, 46, 48, 50 and 52 have data inputs 70, 66, 60, 74, 78 and 82 respectively, which are the normal functional data input ports for the scan registers. In addition, each of the scan registers 42, 44, 46, 48, 50 and 52 have data outputs 72, 68, 64, 76, 80 and 84 respectively. It is contemplated that the illustrative circuit design shown in FIG. 2 may only be a portion of a larger circuit design, and that data input ports 70, 66 and 60 and data output ports 76, 80 and 84 may be coupled to other logic within a larger circuit design.

During normal functional operation, the scan mode control signal (SCAN) 58 is set low, and each of the scan registers 42, 44, 46, 48, 50 and 52 are clocked by the functional clock (CLK) 54. Data is provided to scan registers 42, 44 and 46 via interfaces 70, 66 and 60, respectively and latched therein. When the functional clock (CLK) 54 is clocked, the data is released from scan registers 42, 44 and 46, and is provided to logic block 62 via interfaces 72, 68 and 64, respectively. The data travels through logic block 62, and eventually arrives at scan registers 48, 50 and 52 via interfaces 74, 78 and 82. When the functional clock (CLK) 54 is again clocked, the data on interfaces 74, 78 and 82 is latched into scan registers 48, 50 and 52, respectfully.

To test the illustrative circuit design, the scan mode control signal (SCAN) 58 is set high. This causes the scan registers 42, 44, 46, 48, 50 and 52 to receive the data presented on the scan data input (SDIN) port, rather than the data presented on the functional data input (DIN) ports. To form a scan path, the data output signal of each scan register is coupled to the scan data input (SDIN) port of another scan register.

In the illustrative circuit design, scan register 46 receives a Scan data input (SDIN) signal from another portion of a larger circuit design or in I/O pin of the circuit design. The data output (DOUT) signal of scan register 46 is provided to the scan data input (SDIN) port of scan register 44 via interface 88, as shown. Similarly, the data output (DOUT) signal of scan register 44 is provided to the scan data input (SDIN) port of scan register 42 via interface 90. The data output (DOUT) signal of scan register 42 is then provided to the scan data input (SDIN) port of scan register 48 via interface 92. The data output (DOUT) signal of scan register 48 is provided to the scan data input (SDIN) port of scan register 50 via interface 94. The data output (DOUT) signal of scan register 50 is then provided to the scan data input (SDIN) port of scan register 52 via interface 96. Finally, the data output port of scan register 52 is provided to either another scan data input (SDIN) port of a scan register located in the larger circuit design or to an output pin of the circuit design.

As indicated above, during normal functional operation the serial scan shift registers are placed in functional mode and operate like any other flip-flop. In test mode, however, the serial scan shift registers are configured into a scan path which allows test data to be "serially shifted" through the registers within the design. That is, the test patterns are serially provided to the scan data input (SDIN) port 86. The test clock (TCLK) is then clocked such that the scan data is serially shifted through the scan path. In the illustrative circuit design, the test clock is clocked six (6) times to fully shift in a test pattern into the six scan registers 42, 44, 46, 48, 50, and 52. Once a pattern is fully shifted into the design, the data residing in the serial scan shift registers 42, 44 and 46 travels through the logic block 62 and eventually arrives at either an I/O pin, or in this case, at the inputs of serial scan shift registers 48, 50 and 52. The serial scan shift registers 42, 44, 46, 48, 50 and 52 are then switched into functional mode by setting the scan control input (SCAN) 58 to a low state. Then, the functional clock (CLK) 54 is pulsed once. The functional clock pulse causes the serial scan shift registers 48, 50 and 52 to capture the data that has traveled through the logic block 62. The serial scan shift registers 42, 44, 46, 48, 50 and 52 are then switched back into test mode by asserting the scan control input (SCAN) 58, and the results are shifted out and compared to an expected value.

This process is repeated until an adequate fault coverage is obtained. As can readily be seen, the addition of serial scan shift registers may make selected nodes within a design both controllable and observable, and may increase the fault coverage that can be achieved for a particular circuit design.

Figure 3:
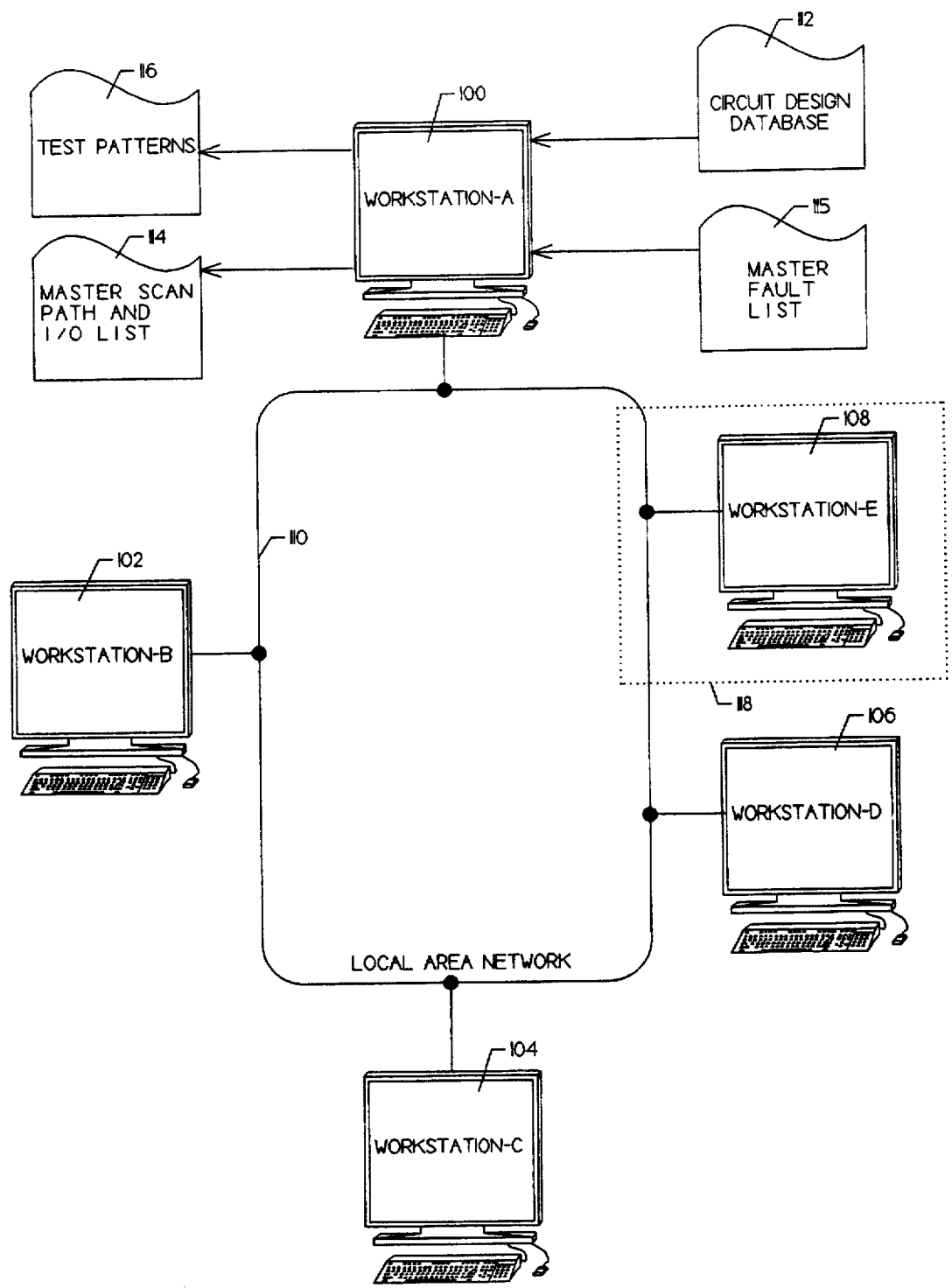
FIG. 3 is a block diagram showing generally the distributed test pattern generation of the preferred embodiment of the present invention.

FIG. 3 is a block diagram showing generally the distributed test pattern generation of the preferred embodiment of the present invention. A number of engineering workstations are provided including engineering workstations 100, 102, 104, 106 and 108. The engineering workstations are connected via a network 110. In the illustrative embodiment, engineering workstation 100 is selected as the master engineering workstation. The master engineering workstation 100 may include control software which may control the overall test pattern generation process. The master engineering workstation 100 may also include a partitioner program, a pattern merge program, and a detected fault list combine program (see below). The control program may include, at least in part, a commercially available network tool that allows the master engineering workstation 100 to monitor the idle CPU time on the remaining workstations 102, 104, 106 and 108, invoke runs on the remaining workstations, and easily transfer data between workstations across the network 110. One such network tool is NetShare SDK, available from Aggregate Computing, Inc.

NetShare and other equivalent network tools may allow the master engineering workstation 100 to select which workstations 102, 104, 106 and 108 to include as slave engineering workstations, and may allow the master engineering workstation 100 to invoke the appropriate runs on the selected slave engineering workstations. Each of the slave engineering workstations may include partitioner software (cone partitioner), an ATPG program, and a pattern merge program (see below).

In the exemplary embodiment, and as indicated above, engineering workstation 100 is the master data processing element. Selected ones of the remaining engineering workstations 102, 104, 106 and 108 are selected to be slave engineering workstations. In a preferred embodiment, the network tool is used to select only those engineering workstations 102, 104, 106 and 108 that have sufficient idle CPU time to be slave engineering workstations. As indicated at 118, engineering workstation-E 108 is determined to not have sufficient idle CPU time, and therefore is not selected as a slave engineering workstation. This allows only those workstations that are relatively free to be used in the test pattern generation process.

The present invention contemplates automatically generating test patterns for a circuit design 112 using the master and selected slave engineering workstations 102, 104, and 106. As such, the present invention can reduce the wall time required to generate the test patterns for the overall circuit design by partitioning the design into a number of partitions, distributing the partitions to the selected slave engineering workstations 102, 104, and 106, and generating test patterns for each partition on the corresponding engineering workstations. The present invention also automatically assembles the resulting local test patterns that are generated for each of the partitions on the slave engineering workstations to reflect the scan structure of the overall circuit design.

In a preferred embodiment, the master engineering workstation 100 read the circuit design database 112 and partition the circuit design 112 into a number of partitions (see below). Each of the resulting partitions is assigned to a particular one of the engineering workstations, and preferably one of the slave engineering workstations 102, 104 or 106. Each of the slave engineering workstations then generates a number of local test patterns for the each of the corresponding partitions. The local test patterns are then transferred to the master engineering workstation 100, where the cumulative set of local test patterns are merged to form a final test pattern set 116.

It is contemplated that the local test patterns may be merged by the slave engineering workstations before the local test patterns are provided to the master engineering workstation. This may reduce the number of local test patterns that must be transferred to the master engineering workstation across the network 110. In either case, the master engineering workstation may still have to merge the cumulative set of local test patterns to provided the final test pattern set 116.

To aid in the merging process, it is contemplated that the master engineering workstation may provide a master scan path and I/O list 114 to each of the slave engineering workstations 102, 104 and 106. The master scan path and I/O list 114 may identify the scan paths within the overall circuit design 112, and the corresponding scan bit positions of each scan register within the design. The master scan path and I/O list 114 may also identifying the I/O pins of the overall circuit design 112. In this way, the master scan path and I/O list 114 may provide each of the slave engineering workstations 102, 104 and 106 with information that defines the scan paths and I/O pins for the overall circuit design 112. Each of the slave engineering workstation 102, 104 and 106 may identify the scan registers in each partition assigned thereto, and by using the master scan path and I/O list 114, may identify the relative position of those scan registers within the overall scan paths of the circuit design 112.

For each local test pattern, the corresponding slave engineering workstations 102, 104 and 106 may provide a starting local test pattern having a number of local test bits (see below). Each of the local test bits may corresponds to one of the number of scan bits and I/O pins identified in the master scan path and I/O list 114. Thus, the starting local test pattern may have a bit width that equals the total number of scan bits in the scan paths of the overall design 112 plus the number I/O pins in the overall design 112. Initially, the starting local test bits may be set to a don't care value (e.g. "X").

Thereafter, and in a preferred embodiment, the slave engineering workstations 102, 104 and 106 may use an ATPG software package (see below) to generate initial local test patterns. The number of test bits in the initial local test patterns may corresponds to the number of registers and/or I/O pins that are set to a value to test the desired logic. For example, for a partition that includes four scan registers, the initial local test pattern may include four bits if all register must be set to test the logic therebetween. Once a first initial local test pattern is generated, the slave engineering workstation, for example, slave engineering workstation 102, may identify the scan bit positions and I/O pins that correspond to the bits in the first initial local test pattern. The correspondence may be identified by noting the instance names of the scan registers or I/O pins set by the first initial local test pattern, and then identifying the corresponding bit position in the overall scan paths or I/O pin by referencing the master scan path and I/O list 114.

Thereafter, the slave engineering workstation 102 may set the starting local test bits that correspond to the scan bit positions and I/O pins of the first initial local test pattern to the corresponding values. The result is a local test pattern (see below), which has a bit width equal to the total number of scan bits in the overall circuit design 112 plus the number of I/O pins in the overall circuit design 112.

After all of the local test patterns are generated, the local test patterns may be merged by simply comparing a first one of test patterns with a second one of test patterns. The first local test pattern may be merged with the second local test pattern if, for example, the bit positions that are set to a value other than a don't-care value do not overlap one another. For example, if a first local test pattern is " ... XX001X0 ... " and a second local test pattern is " ... 10XXXXX ... " then the "set" bit positions do not overlap. If the set bit positions do not overlap, the first and second local test patterns may be merged by simply replacing those bit positions in the first local test pattern with the set bit positions in the second local test pattern, or visa versa. Continuing the above example, the first and second local test pattern could be merged to " ... 1001X0 ... ". A further discussion of this exemplary merging technique can be below with reference to FIG. 6. It is recognized that this is only an exemplary merging technique, and that other merging technique may be used to even further reduce the number of local test patterns that are transferred to the master engineering workstation 100.

Once the local test patterns are merged with one another, as described above, it is contemplated that they may be transferred to the master engineering workstation 100. The master engineering workstation 100 may receive the local test patterns from all of the slave engineering workstations 102, 104 and 106, and in a preferred embodiment, may concatenate the local test patterns and store them in a single file (see FIG. 7). The master engineering workstation 100 may then merge the cumulative set of local test patterns in a similar manner to that described above (see also FIG. 6). The result may be a set of final test patterns 116 which may be provided to automatic test equipment (ATE).

Also, each slave workstation may provide a detected fault list, and may pass its detected fault list back to the master. The master may combine the detected fault lists to create a master fault list 115 with all detected faults marked.

It is contemplated that each of the slave engineering workstations 102, 104 and 016 may include a partitioner (see below) for further partitioning of the partitions that are provided thereto. In a preferred embodiment, the partitioner is a logic cone partitioner that partitions the logic into a number of logic cones (see FIG. 5). A logic cone may be defined as one or more paths that extend from at least one logic designer defined apex net to at least one logic designer defined base net affecting the apex net. For example, all logic extending from an input of a scan register back to either an output of another scan register or an I/O pin may be considered a logic cone, particularly since these nets are typically defined by the circuit designer. The cone partitioner may include a logic tracer for tracing the logic within the circuit design to help identify logic cones therein. A further discussion of partitioning logic into cones can be found in U.S. patent application Ser. No. 08/524,017, filed Aug. 29, 1995, entitled "A Method of Stabilizing Component and Net Names of Integrated Circuits In Electronic Design Automation Systems", which is incorporated herein by reference.

Figure 4:
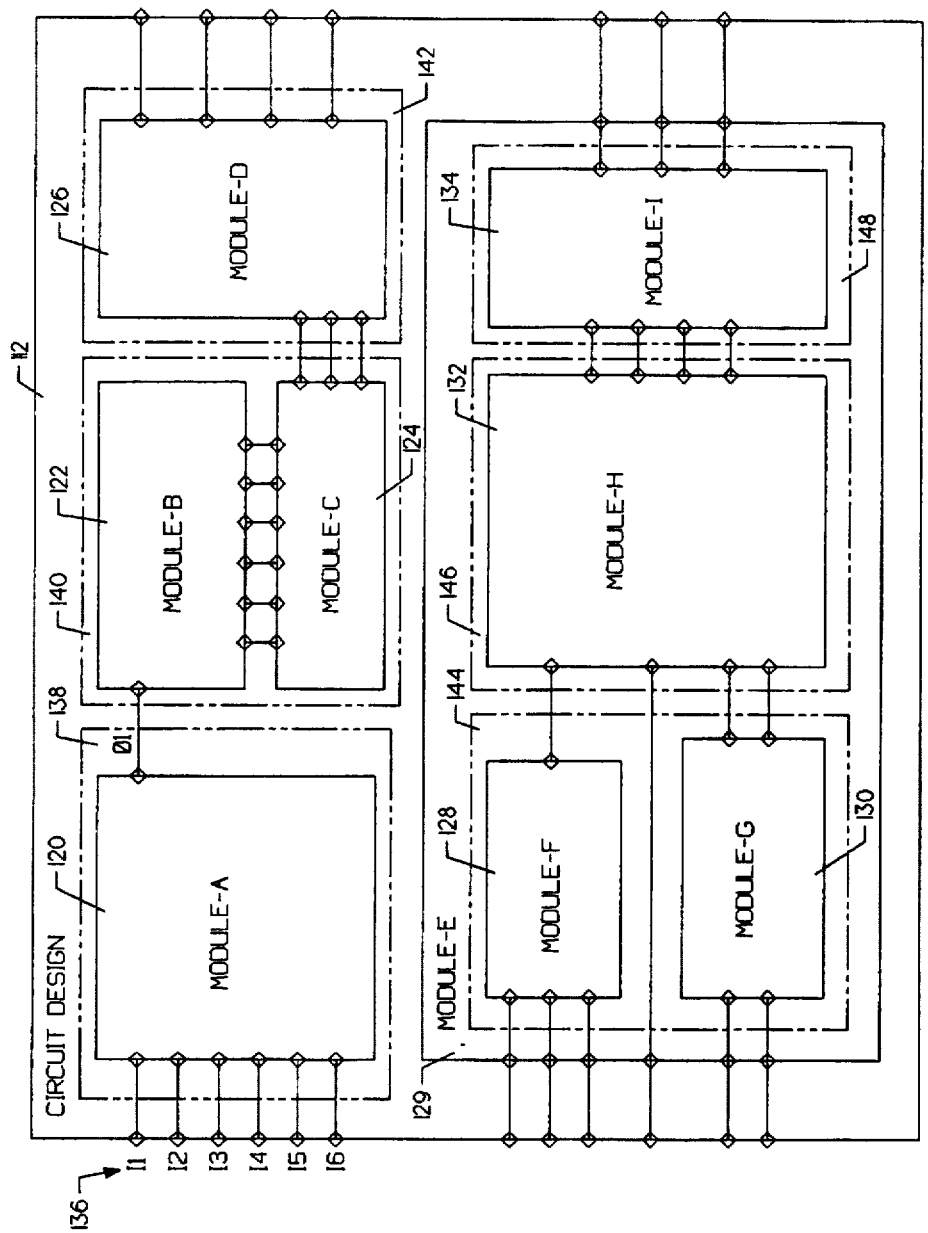
FIG. 4 is a block diagram showing the partitioning of an exemplary circuit design performed by the master data processing element.

FIG. 4 is a block diagram showing the partitioning of an exemplary circuit design performed by the master engineering workstation. The circuit design database is generally shown at 112, and includes a number of hierarchical modules including Module-A 120, Module-B 122, Module-C 124, Module-D 126, and Module-E 129. Module-E 129 includes Module-F 128, Module-G 130, Module-H 132 and Module-I 134. Each of the modules has a number of input ports and a number of output ports. For example, Module-A 120 has input ports I1–I6 and output port 01, as shown. Some of the modules have input and output ports that are coupled to I/O pins of the circuit design. Continuing with the above example, all of the input ports I1–I6 of Module-A 120 are coupled to I/O pins as shown at 136. In addition, some of the modules have input ports that are coupled to output ports of another module. For example, Module-B 122 has an input port that is coupled to the 01 output port of Module-A 120.

The master engineering workstation 100 (see FIG. 3) includes a partitioner program that partitions the circuit design into a number of partitions. In a preferred embodiment, the partitioner program partitions the circuit design so that each partition includes nearly the same number of potential faults. This partitioning strategy may balance the processing required by each of the slave engineering workstations 102, 104 and 106 to generate the corresponding test patterns. Although this is the preferred partitioning strategy, it is recognized that many other partitioning algorithms may be used.

In the illustrative circuit design 112, the partitioner program has partitioned Module-A 120 into a first partition 138. Module-B 122 and Module-C 124 have been partitioned into a second partition 140. Module-D 126 has been partitioned into a third partition 142. Module-F 128 and Module-G 130 have been partitioned into a fourth partition 146. Module-H 132 has been partitioned into a fifth partition. Finally, Module-I 134 has been partitioned into a sixth partition 134.

The master engineering workstation 100 then assigns each of the partitions to the slave engineering workstations 102, 104 and 106. It is contemplated that the master engineering workstation 100 may also assign some of the partitions to itself, if desired. Thereafter, the master engineering workstation 100 sends the partitions to the corresponding slave engineering workstations via the network 110.

Figure 5:
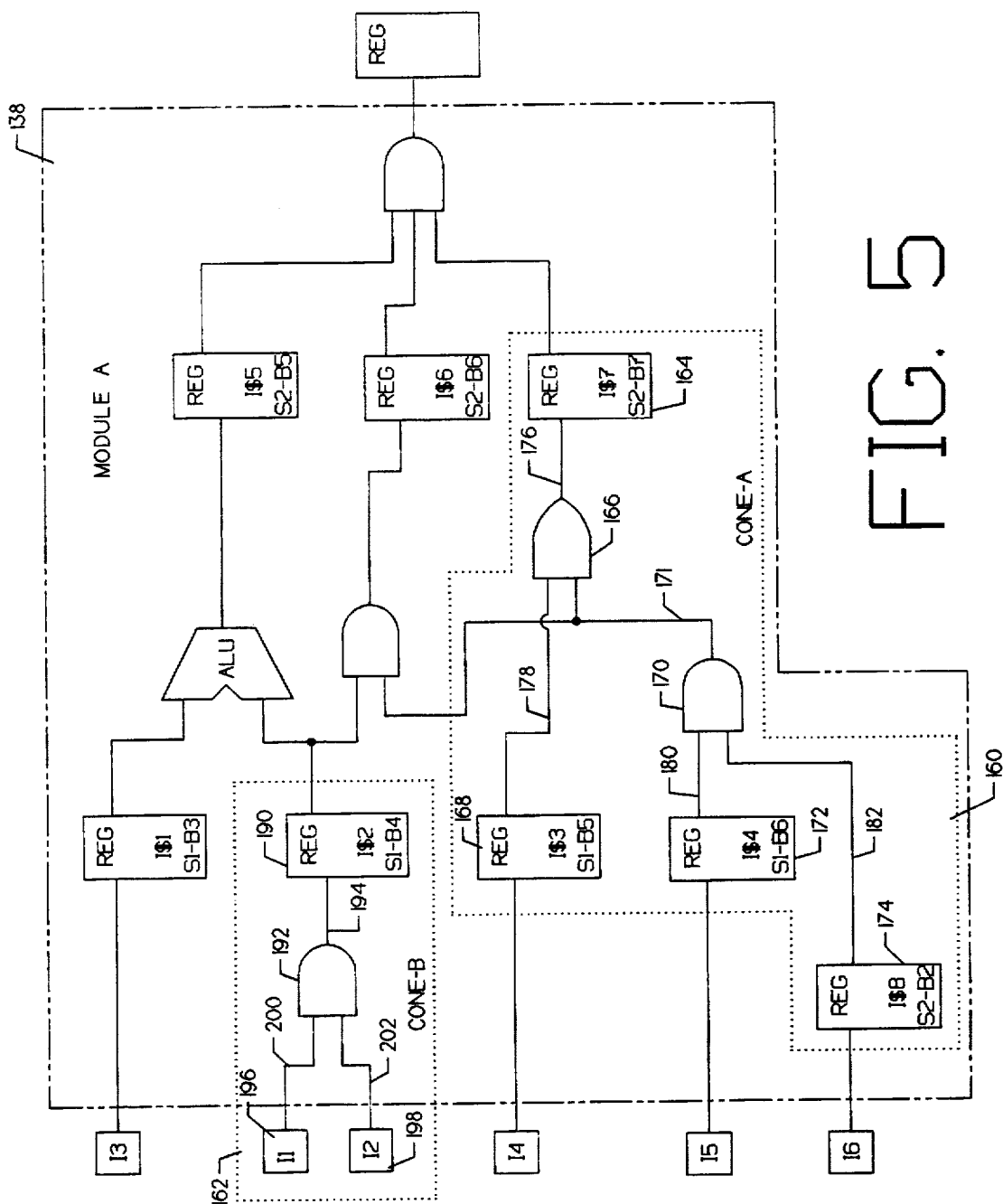
FIG. 5 is a schematic diagram showing a selected partition of FIG. 4, and two illustrative cone partitions identified by a corresponding slave data processing element.

FIG. 5 is a schematic diagram showing a selected partition of FIG. 4, and two illustrative cone partitions identified by a corresponding slave engineering workstation. Each slave engineering workstation receives pre-assigned partitions via the network 110. In the illustrative diagram, slave engineering workstation 102 receives the first partition of the circuit design shown in FIG. 4. As indicated above, the first partition includes Module-A 120. An exemplary schematic diagram of Module-A 120 is shown in FIG. 5.

It is contemplated that each of the slave engineering workstations 102, 104 and 106 may include a partitioner for further partitioning of the corresponding partitions that are provided by the master engineering workstation 100. The partitioner is a logic cone partitioner that partitions the logic into a number of logic cones. A logic cone is defined as one or more paths that extend from at least one logic designer defined apex net to at least one logic designer defined base net affecting the apex net. For example, all logic extending from an input of a scan register back to either an output of another scan register or an I/O pin may be considered a logic cone, particularly since these nets are typically defined by the circuit designer. The cone partitioner may include a logic tracer for tracing the logic within the circuit design to help identify the logic cones therein. A further discussion of partitioning logic into cones can be found in U.S. patent application Ser. No. 08/524,017, filed Aug. 29, 1995, entitled "A Method of Stabilizing Component and Net Names of Integrated Circuits In Electronic Design Automation Systems", which is incorporated herein by reference.

In the illustrative schematic diagram, two logic cones are highlighted, including Cone-A 160 and Cone-B 162. Cone-A 160 has been identified by selecting register 164, and tracing back through the circuit design until either another scan register or an I/O pin is reached. For Cone-A, the cone partitioner selects register 164, and traces back through the design to OR-gate 166 via interface 176. The cone partitioner then traces back to register 168 via interface 178. Since register 168 is another scan register, the cone partitioner may not continue to trace any logic further back than register 168. Referring back to Or-gate 166, the cone partitioner may trace back to AND-gate 170 via interface 171. Then, the cone partitioner may trace back to registers 172 and 174 via interfaces 180 and 182, respectively. Since registers 172 and 174 are scan registers, the cone partitioner may not trace any logic further back therefrom. Thus, Cone-A 160 includes registers 168, 172, 174 and 164, and logic gates 166 and 170, as shown.

Likewise, Cone-B 162 is identified by selecting register 190, and tracing back through the circuit design until either another scan register or an I/O pin is reached. For Cone-B 162, the cone partitioner selects register 190, and traces back through the AND-gate 192 via interface 194, and to input pins 196 and 198, as shown.

In a preferred embodiment, the cone partitioner selects each scan register and I/O pin in the circuit design, and for each selection, traces the logic back to another scan register or I/O pin. Each of the selections may result in a logic cone.

After all of the logic cones are identified, ATPG software may be used to generate a number of initial local test pattern for each logic cone. Preferably, the ATPG software is capable of eliminating test patterns that test for equivalent faults within the design. For Cone-A 160, the ATPG software may set the values in registers 168, 172 and 174 to "011". This may test the path that extends through AND-gate 170, through OR-Gate 166 and to register 164 in a high state. The ATPG software may also set the values in register 168, 172 and 174 to "0X0". This may test the same path in a low state. Finally, the ATPG software may set the values in register 168, 172 and 174 to "1X0". This may test the path from register 168, through OR-gate 166 and to register 164 in a high state. Thus, the initial local test patterns for Cone-A 160 may be "011", "0X0" and "1X0". The ATPG software may be used in a similar manner to generate the initial test patterns for all other cones identified by the cone partitioner.

Each of the registers in FIG. 5 have an instance name associated therewith. For example, register 164 has an instance name of "I$7". In a typical circuit design database, each component has a unique instance name. The instance name identifies the corresponding instance from all other components within the design.

As indicated above, the master engineering workstation 100 may provide a master scan path and I/O list 114 to each slave engineering workstation 102, 104 and 106. In a preferred embodiment, the master scan path and I/O list 114 identifies the scan paths within the overall circuit design 112, and the corresponding scan bit positions of each scan register within the scan paths. The master scan path and I/O list 114 may also identifying the I/O pins of the overall circuit design. In this way, the master scan path and I/O list 114 may provide each of the slave engineering workstations with information that defines the scan paths and I/O pins for the overall circuit design 112.

The master scan path and I/O list 114 may include the instance names for all of the scan registers within the design, along with corresponding scan string and bit position. For example, the master scan path and I/O list 114 may list instance I$7 followed by the designation "S2-B3". In the illustrative embodiment, the S2-B3 designation indicates that instance I$7 is in the second scan string and is located in the third position thereof.

As indicated above, each of the slave engineering workstations may identify the scan registers in each of the corresponding partitions. By using the master scan path and I/O list 114, the slave engineering workstations may identify the relative position of those scan registers relative to the overall scan paths. The resulting scan path and bit position are indicated on each scan register of FIG. 5. For example, register 168 is identified as "S1-B5" meaning that it is located in the first scan string and is in the fifth bit position. Similarly, register 172 is identified as "S1-B6" meaning that it is located in the first scan string and is in the sixth bit position. The slave engineering workstation may identity this information by examining the master scan path and I/O list 114.

Figure 6:
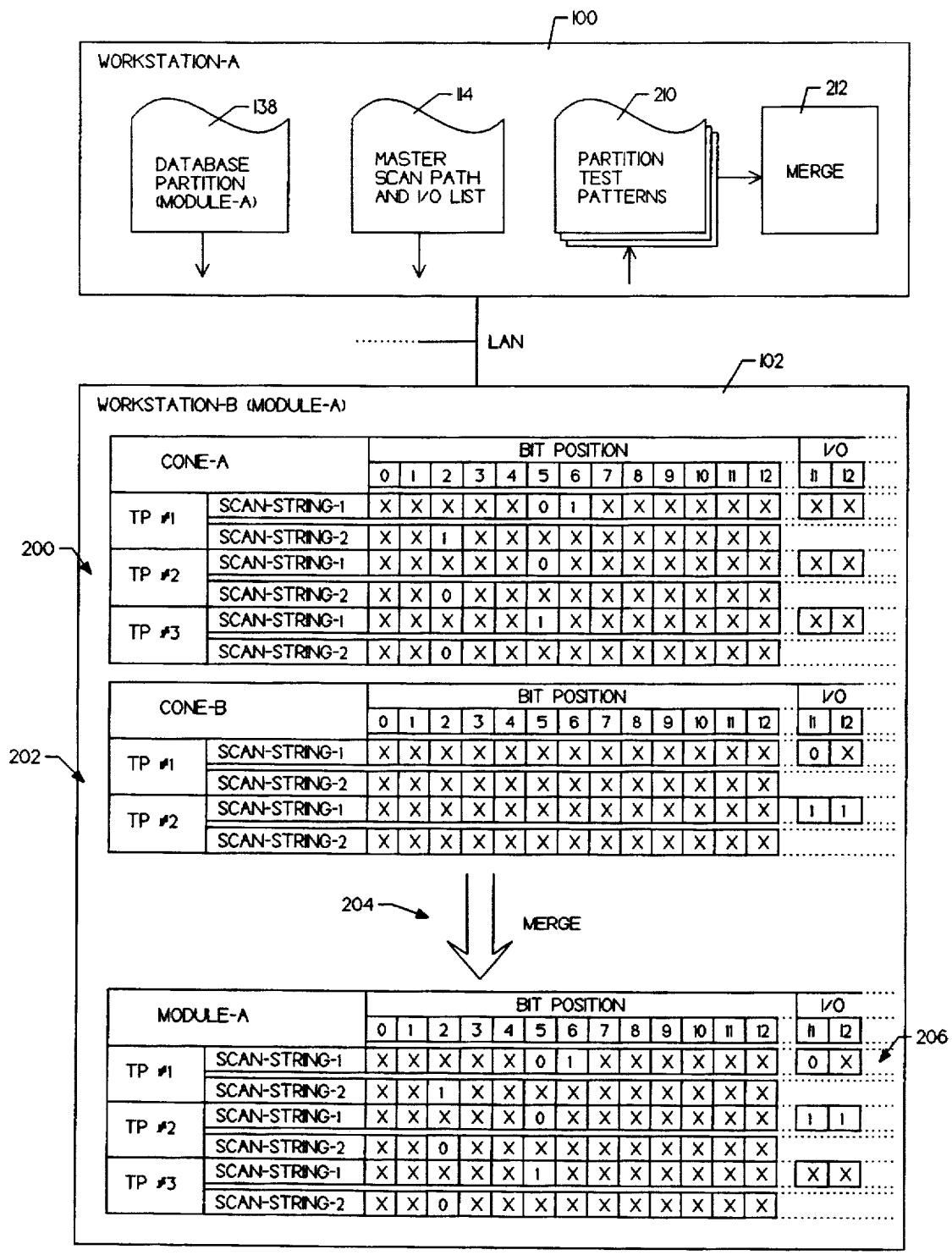
FIG. 6 illustrates the merging of selected local test patterns.

FIG. 6 illustrates the merging of selected local test patterns. As indicated above, the master engineering workstation 100 may provide a database partition 138 to slave engineering workstation 102, as shown. Likewise, the master engineering workstation 100 may provide a master scan path and I/O list 114 to slave engineering workstation 102. After the slave engineering workstations generate the expanded test patterns for the corresponding database partitions, the slave engineering workstations provide the local test patterns to the master engineering workstation 100, as shown at 210. The master engineering workstation 100 preferably concatenates the local test patterns received from the number of slave engineering workstations into the single file 210. Thereafter, the master engineering workstation 100 merges the cumulative set of local test patterns to provide a final test pattern set.

For each of the initial local test pattern, as described above, the corresponding slave engineering workstation may provide a starting local test pattern having a number of local test bits. Each of the local test bits may corresponds to one of the number of scan bits and I/O pins identified in the master scan path and I/O list 114. Thus, the starting local test pattern may have a bit width that equals the total number of scan bits in the scan paths of the overall design 112 plus the number I/O pins in the overall design.

As indicated above, the number of test bits in the initial local test patterns may corresponds to the number of registers and/or I/O pins that are required to test the corresponding logic cone. For example, for a logic cone that includes four scan registers, the initial local test pattern may include four bits. Once a first initial local test pattern is generated, the slave engineering workstation may identify the scan bit positions and I/O pins that correspond to the bits in the first initial local test pattern. The correspondence may be identified by noting the instance names of the scan registers or I/O pins set by the first initial local test pattern, and then identifying the corresponding bit position in the overall scan paths or I/O pin by referencing the master scan path and I/O list 114.

Thereafter, the slave engineering workstation may set the starting local test bits that correspond to the scan bit positions and I/O pins of the first initial local test pattern to the corresponding values. The result is a local test pattern, which has a bit width equal to the total number of scan bits in the overall circuit design plus the number of I/O pins in the overall circuit design. A number of local test patterns for Cone-A (see FIG. 5) are shown at 200. Each local test pattern, for example TP #1, includes a bit position for each register in the corresponding scan path. In addition, each I/O pin is represented, as shown. In the illustrative embodiment, most of the bit positions are set to a "don't-care value" of "X". Only the bit positions that are required to test the corresponding logic cones have a value associated therewith. Illustrative local test patterns are also shown for Cone-B of Module-A (see FIG. 5).

After all of the local test patterns are generated, the local test patterns are merged together to produce a reduced number of local test patterns. The merging process is generally shown at 204. All of the test patterns including TP #1-3 for Cone-A and TP #1-2 for Cone-B may be merged.

A preferred embodiment of the present invention merges the local test patterns by simply comparing a first one of test patterns with a second one of test patterns, and determining if, for example, the bit positions that are set to a value other than a don't-care value overlap one another. For example, the TP #1 test pattern for Cone-A is "XXXXX01XXXXX . . . XX . . . " and "XX1XXXXXXXXXX . . . XX . . . ", wherein the first pattern corresponds to the first scan path and the second pattern corresponds to the second scan path. In the present example, the first scan path and the second scan path work in conjunction to test a desired logic cone. Thus, a second test pattern must not conflict with either scan path if the patterns are to be combined. The TP #2 test pattern for Cone-A is "XXXXX0XXXXXXX . . . XX . . . " and "XX0XXXXXXXXXX . . . XX . . . ". In the present case, the third bit position in the second scan string conflicts with the first test pattern. Thus, these test patterns may not be combined. Continuing with the example, however, the TP #1 test pattern for Cone-B is "XXXXXXXXXXXXX . . . 0X . . . ". Since this test pattern does not have any conflicting bit positions with TP #1 of Cone-A, these test patterns may be combined, as shown at 206. The TP #2 test pattern for Cone-B may be similarly combined with TP #2 for Cone-A, as shown.

Once the local test patterns are merged with one another, as described above, it is contemplated that they may be transferred to the master engineering workstation 100. The master engineering workstation may receive the local test patterns from all of the slave engineering workstations, and in a preferred embodiment, may concatenate the local test patterns and store them in a single file 210. The master engineering workstation 100 may then merge the cumulative set of local test patterns in a similar manner to that described above. The result may be a set of final test patterns which may be provided to automatic test equipment (ATE). The master workstation may also collect the detected fault lists from each slave and combine them to produce a master detected fault list.

Figure 7:
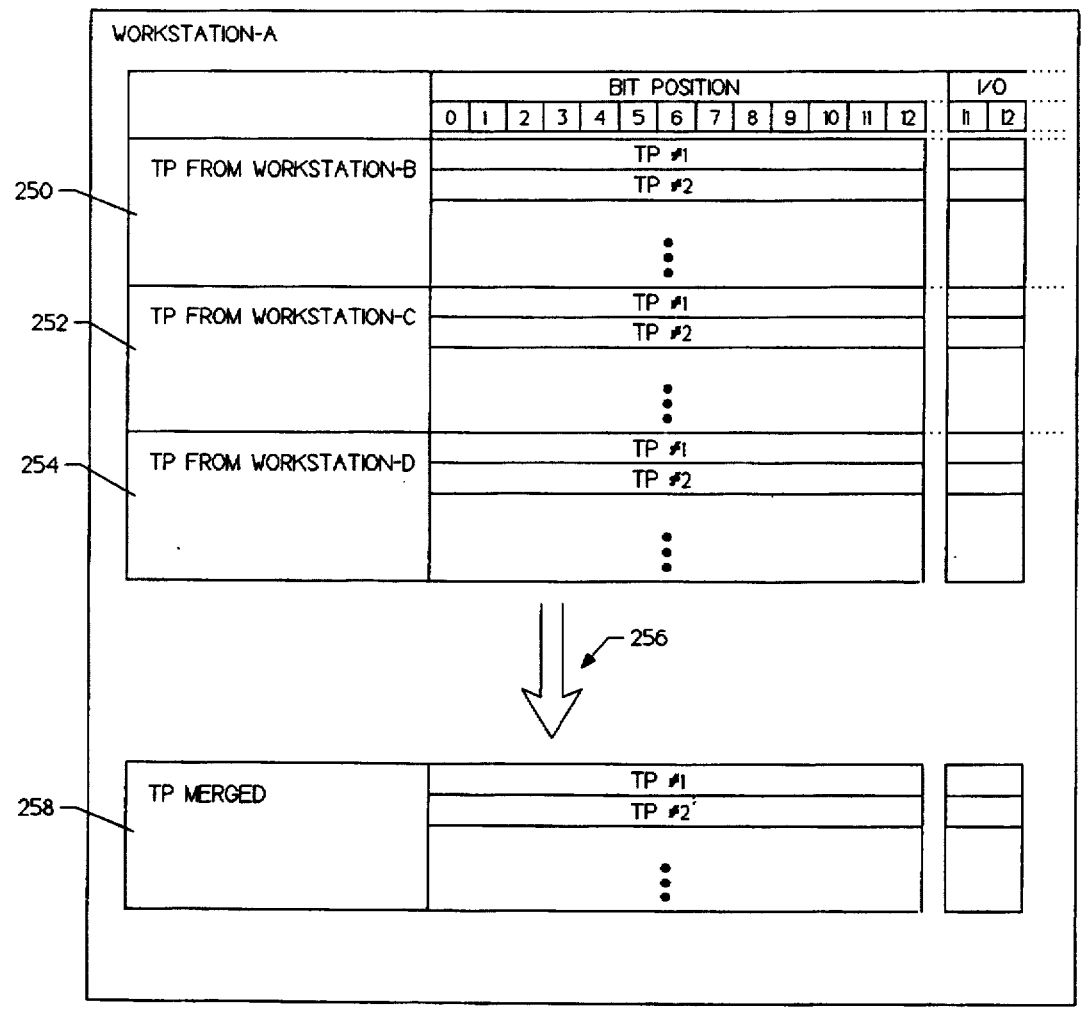
FIG. 7 illustrates the merging of selected expanded test patterns by the master engineering workstation.

FIG. 7 illustrates the merging of selected local test patterns by the master engineering workstation. As indicated in FIG. 6, the master engineering workstation 100 receives the local test patterns 210 from the number of slave engineering workstations 102, 104 and 106. The master engineering workstation then merges the cumulative set of local test patterns (as shown at 212 of FIG. 6), and provides a final test pattern set.

FIG. 7 shows the cumulative set of local test patterns provided by the slave workstations 102, 104 and 106. The local test patterns received from slave workstations 102 are shown at 250. The local test patterns received from slave workstations 104 are shown at 252. The local test patterns received from slave workstations 106 are shown at 254. In a preferred embodiment, the local test patterns received from the slave engineering workstations are concatenated into a single file, as shown.

Using the same merging process as described with reference to FIG. 6, the cumulative set of local test patterns are merged into a final test pattern set, as shown at 258.

In a preferred embodiment, each of the local test pattern sets provided by the slave engineering workstations include a header, which provides selected information regarding the corresponding test pattern set. When the local test pattern sets are concatenated, the master engineering workstation may remove the header information to leave a concatenated file containing raw local test patterns. A text editor, parser or special program may be used to remove the header information from the local test pattern sets prior to concatenation.

Figure 8:
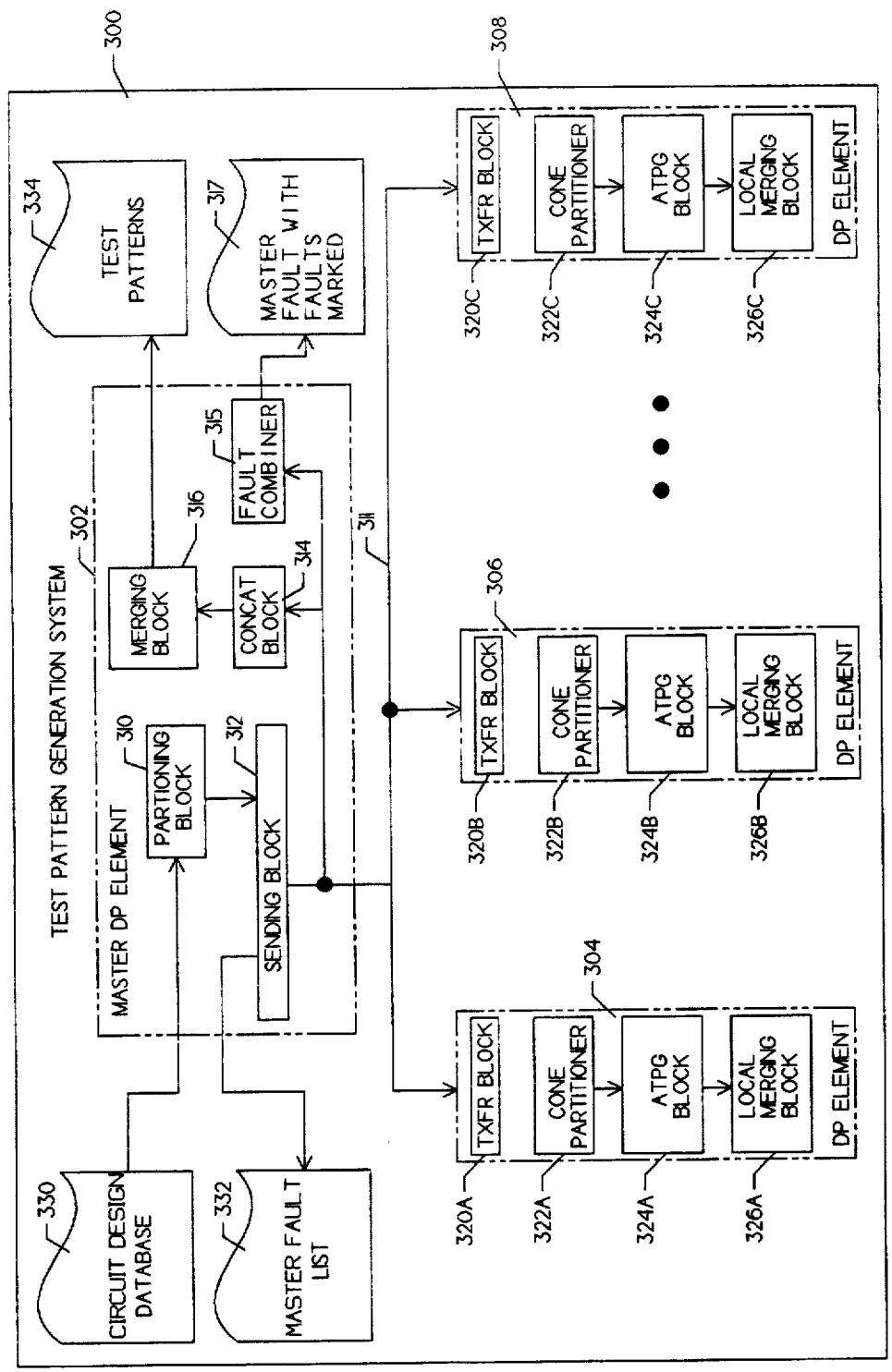
FIG. 8 is a schematic diagram of a test pattern generation system in accordance with the present invention.

FIG. 8 is a schematic diagram of a test pattern generation system in accordance with the present invention. The test pattern generation system is shown at 300, and includes a master data processing element 302 and a number of slave data processing elements 304, 306 and 308. The slave data processing elements 304, 306 and 308 are coupled to the master data processing element 302 via an interface 310. The master data processing element 302 includes a partitioning block 310, a sending block 312, a concatenating block 314 and a merging block 302. The master data processing element may further include a control block (not shown), for controlling the test pattern generation system.

Each of the slave data processing elements include a transfer block 320A, 320B and 320C, a cone partitioner block 322A, 322B and 322C, an ATPG block 324A, 324B, 324C, and a local merging block 326A, 326B and 326C.

The master data processing element reads circuit design database 330, wherein the partitioning block 310 partitions the circuit design database 330 into a number of partitions. Each of the resulting partitions (not shown) is assigned to a particular one of the slave data processing elements 304, 306 and 308. The sending block 312 then sends each of the partitions to the appropriate slave data processing element via interface 311.

Each of the slave data processing elements may then receives the partitions provided by the sending block via transfer blocks 320A, 320B and 320C. The transfer blocks recognize the interface protocol of interface 311 and sending block 312.

Once the partitions are received, the cone partitioner blocks, for example cone partitioner block 322A, partitions each of the partitions into a number of logic cones, as described above. With respect to slave data processing element 204, the resulting logic cones are then provided to the ATPG block 324A, which generates a number of local test patterns for the each of the corresponding partitions.

The local test patterns are then provided to local merging block 326A. The local merging block 326A merges the local test patterns to provide a reduced set of local test patterns. Thereafter, the transfer block 320A may transfer the resulting local test patterns to the master data processing element via interface 311.

The concatenating block 314 receives the local test pattern sets from each of the slave data processing elements 304, 306 and 308, and concatenates the test pattern sets into a single file. The resulting cumulative set of local test pattern sets are provided to merging block 316. Merging block 316 merges the cumulative test pattern set, and provides a final test pattern set 334. In addition, the master data processing element may collect detected fault lists (not shown) from each slave and combine them via combining block 315 to provide a master detected fault list 317.

It is contemplated that the master data processing element 302 may provide a master scan path and I/O list 332 to each of the slave data processing elements via the sending block 312. The master scan path and I/O list 332 may identify the scan paths within the overall circuit design 330, and the corresponding scan bit positions of each scan register within the scan paths. The master scan path and I/O list 332 may also identifying the I/O pins of the overall circuit design. In this way, the master scan path and I/O list 332 may provide each of the slave data processing elements 304, 306 and 308 with information that defines the scan paths and I/O pins for the overall circuit design 330.

Finally, each of the local test patterns may be generated by the ATPG blocks 324A, 324B and 324C by providing a starting local test pattern having a number of local test bits. Each of the starting local test bits may corresponds to one of the number of scan bits and I/O pins identified in the master scan path and I/O list 332. Thus, the starting local test pattern may have a bit width that equals the total number of scan bits in the scan paths of the overall design plus the number I/O pins in the overall design. Initially, the starting local test bits may be set to a don't care value (e.g. "X").

Thereafter, and in a preferred embodiment, the ATPG blocks in the slave data processing elements may generate initial local test patterns. The number of test bits in the initial local test patterns may corresponds to the number of registers and/or I/O pins that are set to a value to test the desired logic. For example, for a partition that includes four scan registers, the initial local test pattern may include four bits if all register must be set to test the logic therebetween. Once a first initial local test pattern is generated, the slave data processing element may identify the scan bit positions and I/O pins that correspond to the bits in the first initial local test pattern. The correspondence may be identified by noting the instance names of the scan registers or I/O pins set by the first initial local test pattern, and then identifying the corresponding bit position in the overall scan paths or I/O pin by referencing the master scan path and I/O list.

Thereafter, the slave data processing elements may set the starting local test bits that correspond to the scan bit positions and I/O pins of the first initial local test pattern to the corresponding values. The result is an local test pattern, which has a bit width equal to the total number of scan bits in the overall circuit design plus the number of I/O pins in the overall circuit design.

After all of the local test patterns are generated, the local test patterns may be merged by the local merging blocks 326A, 326B and 326C by simply comparing a first one of the expanded test patterns with a second one of the expanded test patterns. The first local test pattern may be merged with the second local test pattern if, for example, the bit positions that are set to a value other than a don't-care value do not overlap one another. For example, if a first local test pattern is " ... XX001X0 ... " and a second local test pattern is " ... 10XXXXX ... " then the "set" bit positions do not overlap. If the set bit positions do not overlap, the first and second local test patterns may be merged by simply replacing those bit positions in the first local test pattern with the set bit positions in the second local test pattern, or visa versa. Continuing the above example, the first and second local test pattern could be merged to " ... 10001X0 ... ". It is recognized that this is only an exemplary merging technique, and that other merging technique may be used to even further reduce the number of local test patterns that are transferred to the master data processing element.

Once the local test patterns are merged with one another, as described above, it is contemplated that they may be transferred to the master data processing element, as described above.

Figure 9A:
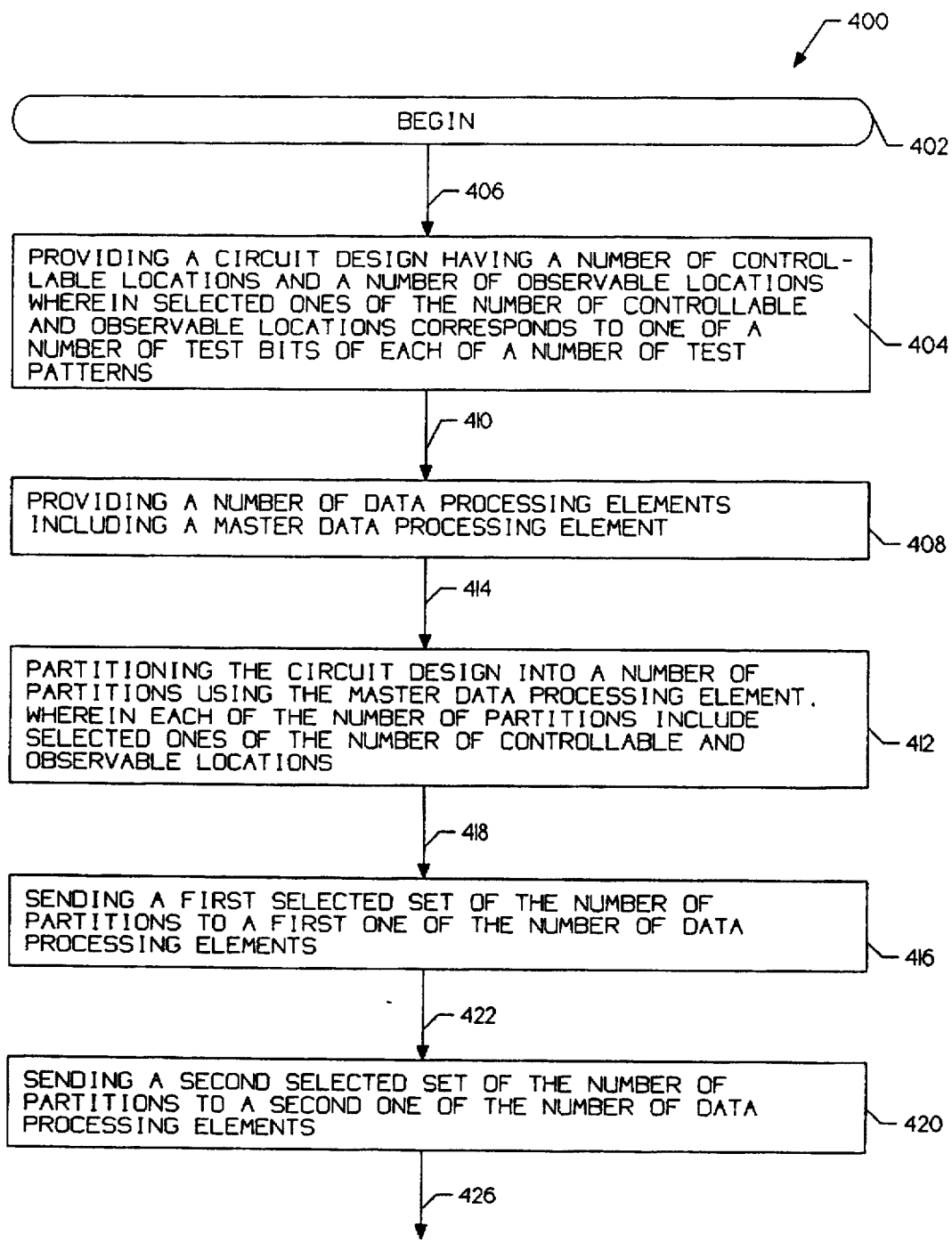
FIG. 9A and FIG. 9B depict a flow diagram showing a first exemplary method of the present invention.
Figure 9B:
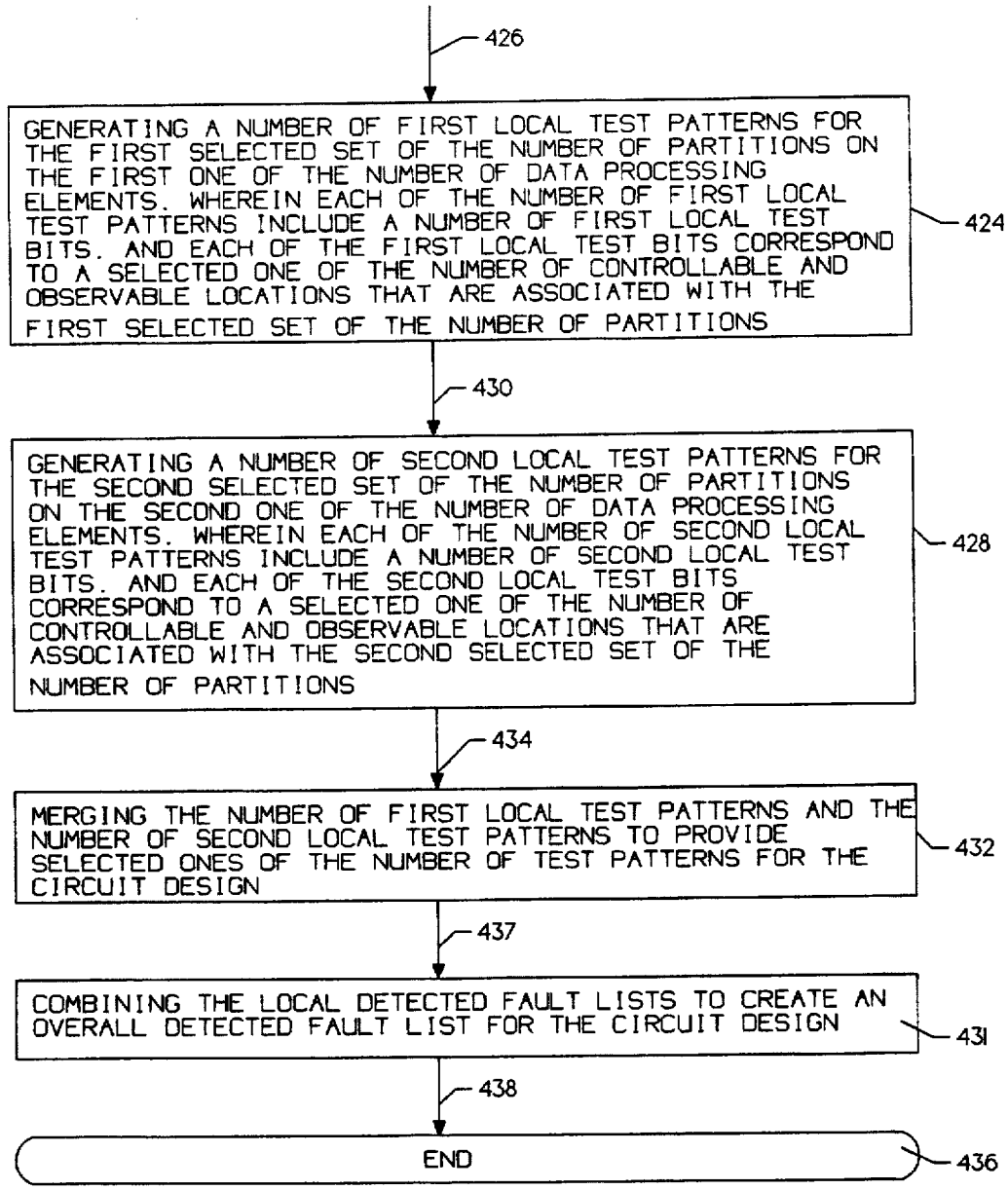

FIG. 9A and FIG. 9B depict a flow diagram showing a first exemplary method of the present invention. The algorithm is generally shown at 400, and is entered at element 402. Control is passed to element 404 via path 406. Element 404 provides a circuit design having a number of controllable locations and a number of observable locations. Selected ones of the number of controllable and observable locations correspond to one of a number of test bits of each of a number of test patterns. Control is then passed to element 408 via path 410. Element 408 provides a number of data processing elements including a master data processing element. Control is then passed to element 412 via path 414.

Element 412 partitions the circuit design into a number of partitions using the master data processing element. Each of the number of partitions include selected ones of the number of controllable and observable locations. Control is then passed to element 416 via path 418. Element 416 sends a first selected set of the number of partitions to a first one of the number of data processing elements. Control is then passed to element 420 via path 422. Element 420 sends a second selected set of the number of partitions to a second one of the number of data processing elements. Control is then passed to element 424 via path 426.

Element 424 generates a number of first local test patterns for the first selected set of the number of partitions on the first one of the number of data processing elements. Each of the number of first local test patterns include a number of first local test bits, and each of the first local test bits correspond to a selected one of the number of controllable and observable locations that are associated with the first selected set of the number of partitions. Element 424 also generates a detected fault list for each of the first selected set of partitions. Control is then passed to element 428 via path 430.

Element 428 generates a number of second local test patterns for the second selected set of the number of partitions on the second one of the number of data processing elements. Each of the number of second local test patterns include a number of second local test bits, and each of the second local test bits correspond to a selected one of the number of controllable and observable locations that are associated with the second selected set of the number of partitions. Element 428 also generates a detected fault list for each of the second selected set of partitions. Control is then passed to element 432 via path 434.

Element 432 merges the number of first local test patterns and the number of second local test patterns to provide selected ones of the number of test patterns for the circuit design. Control is then passed to element 431 via interface 437. Element 431 combines the local detected fault lists to create an overall detected fault list for the circuit design. Control is then passed to element 436 via path 438, wherein the algorithm is exited.

Figure 10:
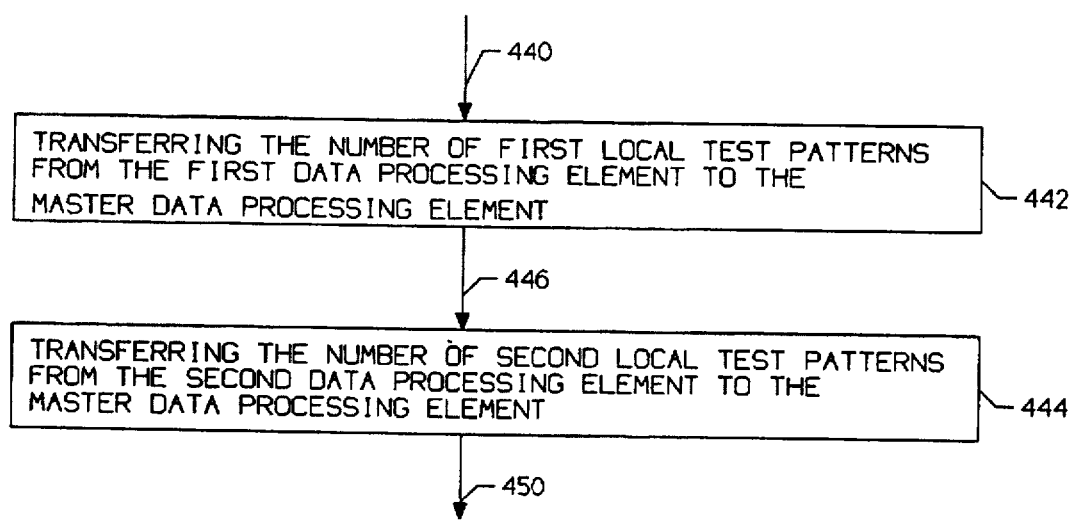
FIG. 10 is a flow diagram showing additional steps that may be added to the first exemplary method shown in FIG. 9A and FIG. 9B.

FIG. 10 is a flow diagram showing additional steps that may be added to the first exemplary method shown in FIG. 9A and FIG. 9B. In a preferred embodiment, elements 442 and 444 are inserted between element 428 and element 432 of FIG. 9B. In this embodiment, control is passed from element 428 of FIG. 9B to element 442 via path 440. Element 442 transfers the number of first local test patterns from the first data processing element to the master data processing element. Control is then passed to element 444 via path 446. Element 444 transfers the number of second local test patterns from the second data processing element to the master data processing element. Control is then passed to element 432 of FIG. 9B via path 450, wherein the first and second local test patterns are merged thereby.

Figure 11:
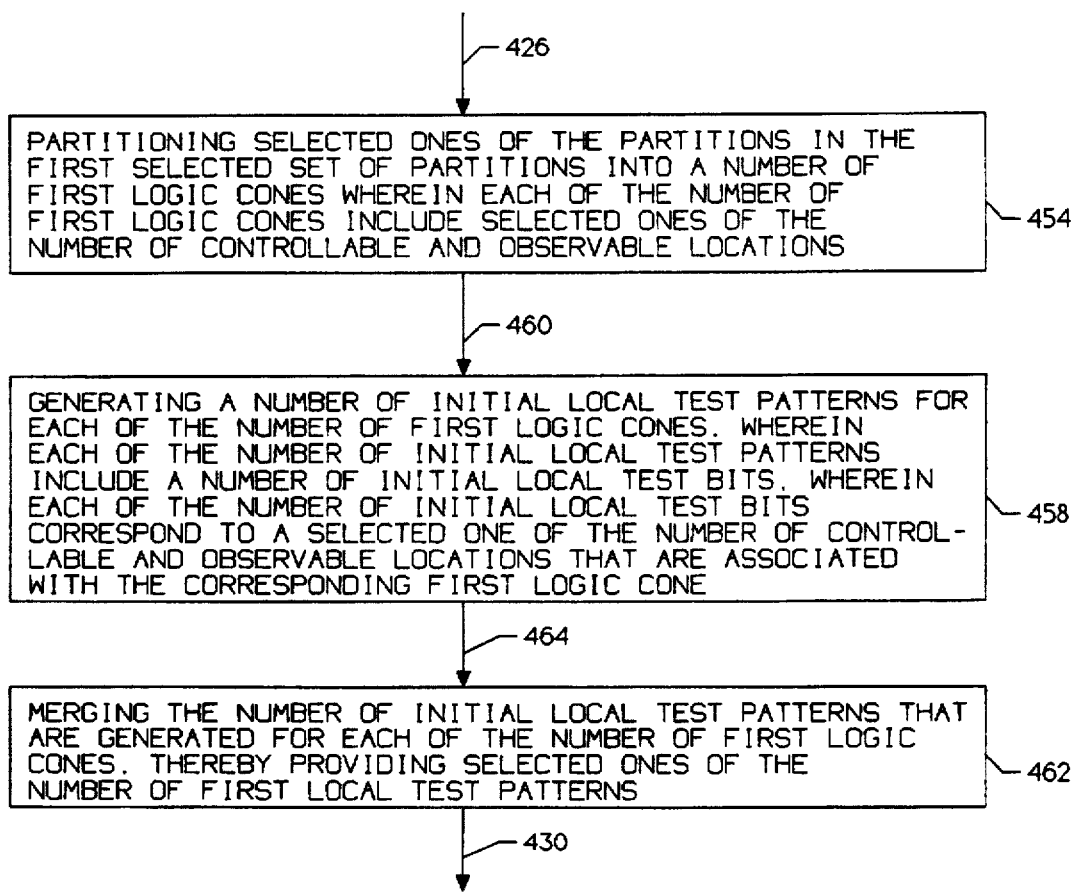
FIG. 11 is a flow diagram showing an illustrative method for performing the generating steps of FIG. 9A and FIG. 9B.

FIG. 11 is a flow diagram showing an illustrative method for performing the generating steps 424 and 428 of FIG. 9B. In the illustrative embodiment, the steps shown in FIG. 11 supplement the generating step 424 of FIG. 9B. In this embodiment, control is passed from element 420 of FIG. 9A to element 454 via path 426. Element 454 partitions selected ones of the partitions in the first selected set of partitions into a number of first logic cones, wherein each of the number of first logic cones includes selected ones of the number of controllable and observable locations. Control is then passed to element 458 via path 460. Element 458 generates a number of initial local test patterns for each of the number of first logic cones, wherein each of the number of initial local test patterns includes a number of initial local test bits. Each of the number of initial local test bits correspond to a selected one of the number of controllable and observable locations that are associated with the corresponding first logic cone. Control is then passed to element 462 via path 464. Element 462 merges the number of initial local test patterns that are generated for each of the number of first logic cones, thereby providing selected ones of the number of first local test patterns. Control is then passed to element 428 of FIG. 9B via path 430.

Figure 12A:
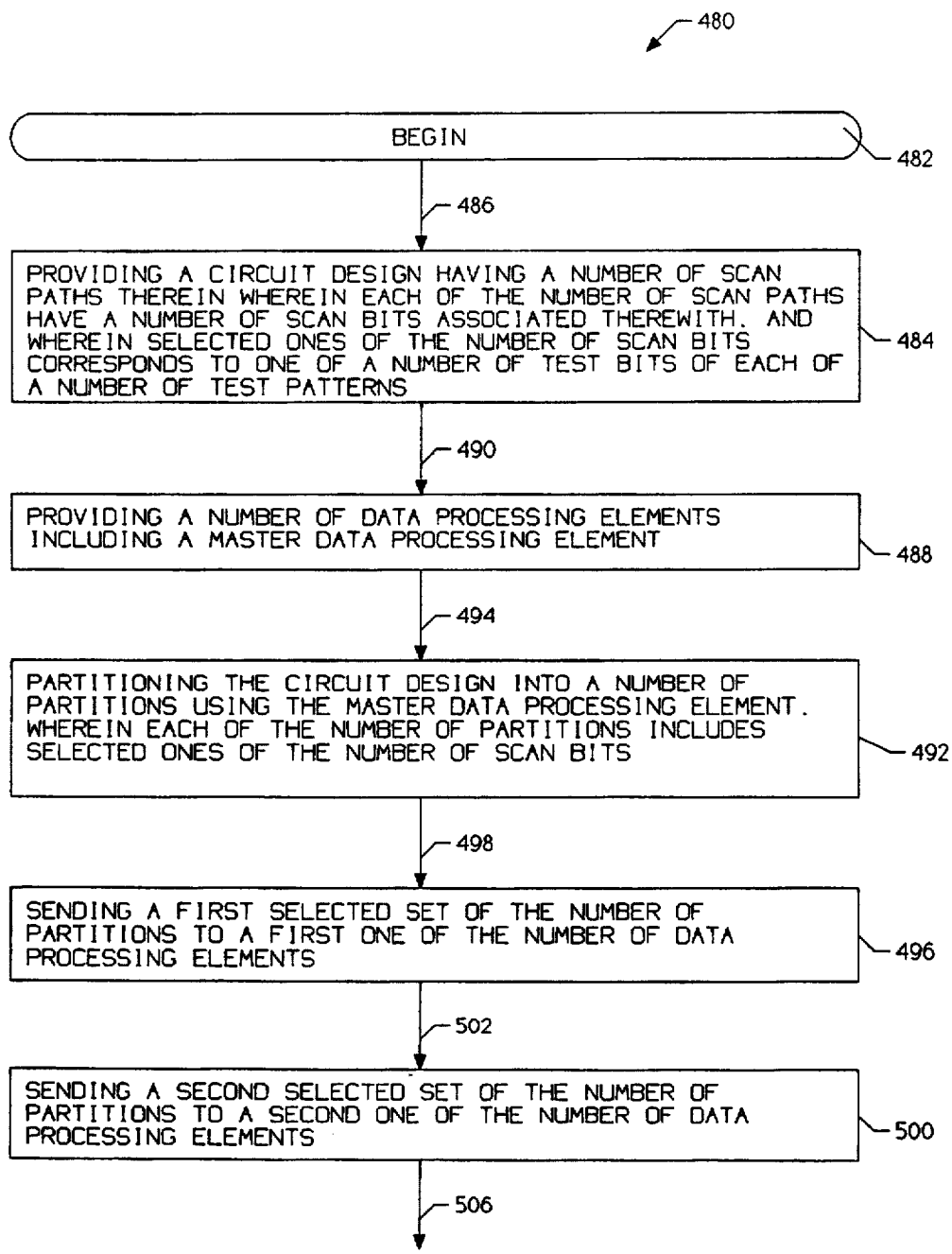
FIG. 12A and FIG. 12B depict a flow diagram showing a second exemplary method of the present invention.
Figure 12B:
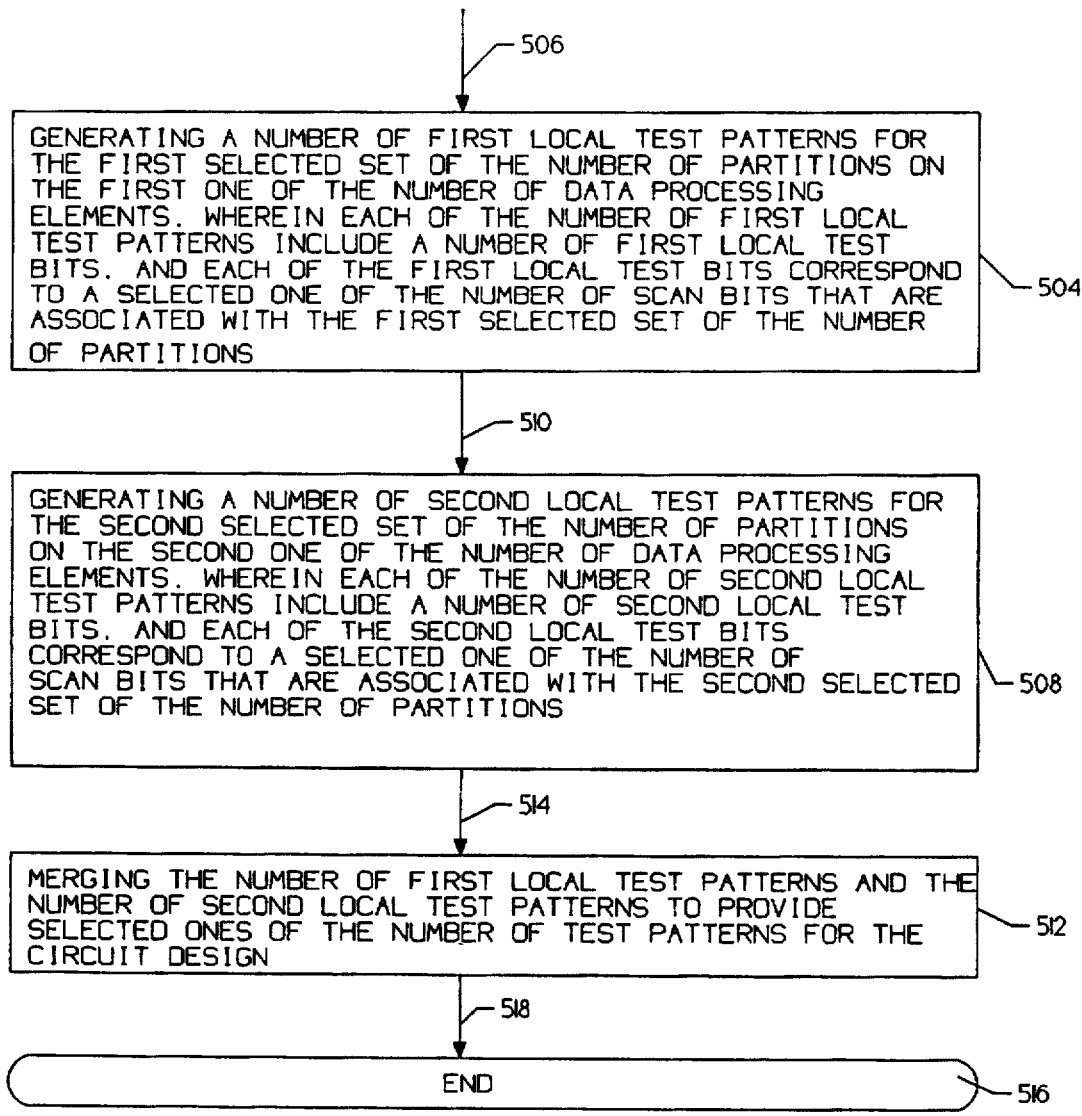

FIG. 12A and FIG. 12B depict a flow diagram showing a second exemplary method of the present invention. The algorithm is generally shown at 480 and is entered at element 482. Control is passed to element 484 via path 486. Element 484 provides a circuit design having a number of scanned paths. Each of the number of scanned paths have a number of scanned bits associated therewith, wherein selected ones of the number of scanned bits correspond to one of a number of test bits of each of a number of test patterns. Control is passed to element 488 via path 490.

Element 488 provides a number of data processing elements, including a master data processing element. Control is then passed to element 492 via path 494. Element 492 partitions the circuit design into a number of partitions using the master data processing element, wherein each of the number of partitions includes selected ones of the number of scan bits. Control is then passed to element 496 via path 498.

Element 496 sends a first selected set of the number of partitions to a first one of the number of data processing elements. Control is then passed to element 500 via path 502. Element 500 sends a second selected set of the number of partitions to a second one of the number of data processing elements. Control is then passed to element 504 via path 506.

Element 504 generates a number of first local test patterns for the first selected set of the number of partitions on the first one of the number of data processing elements. Each of the number of first local test patterns include a number of first local test bits, and each of the first local test bits correspond to a selected one of the number of scan bits that are associated with the first selected set of the number of partitions. Control is passed to element 508 via path 510.

Element 508 generates a number of second local test patterns for the second selected set of the number of partitions on the second one of the number of data processing elements. Each of the number of second local test patterns include a number of second local test bits, and each of the second local test bits correspond to a selected one of the number of scanned bits that are associated with the second selected set of the number of partitions. Control is passed to element 512 via path 514.

Element 512 merges the number of first local test patterns and the number of second local test patterns to provide selected ones of the number of test patterns for the circuit design. Control is then passed to element 516 via path 518, wherein the algorithm is exited.

Figure 13:
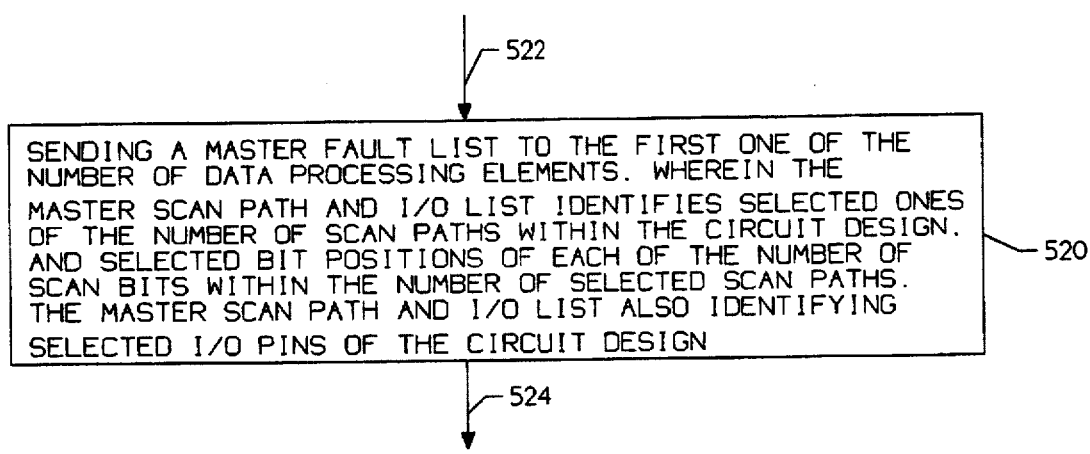
FIG. 13 shows an additional step that may be added to the second exemplary method shown in FIG. 12A and FIG. 12B.

FIG. 13 shows an additional step that may be added to the second exemplary method shown in FIG. 12A and FIG. 12B. The additional step includes sending a master scan path and I/O list to the first one of the number of data processing elements. The master scan path and I/O list identifies selected ones of the number of scanned paths within the circuit design, and selected bit positions of each of the number of scanned bits within the number of selected scan paths. The master scan path and I/O list also identifies selected I/O pins of the circuit design. It is also contemplated that the master scan path and I/O list may be sent to the second one of the number of data processing elements.

Figure 14:
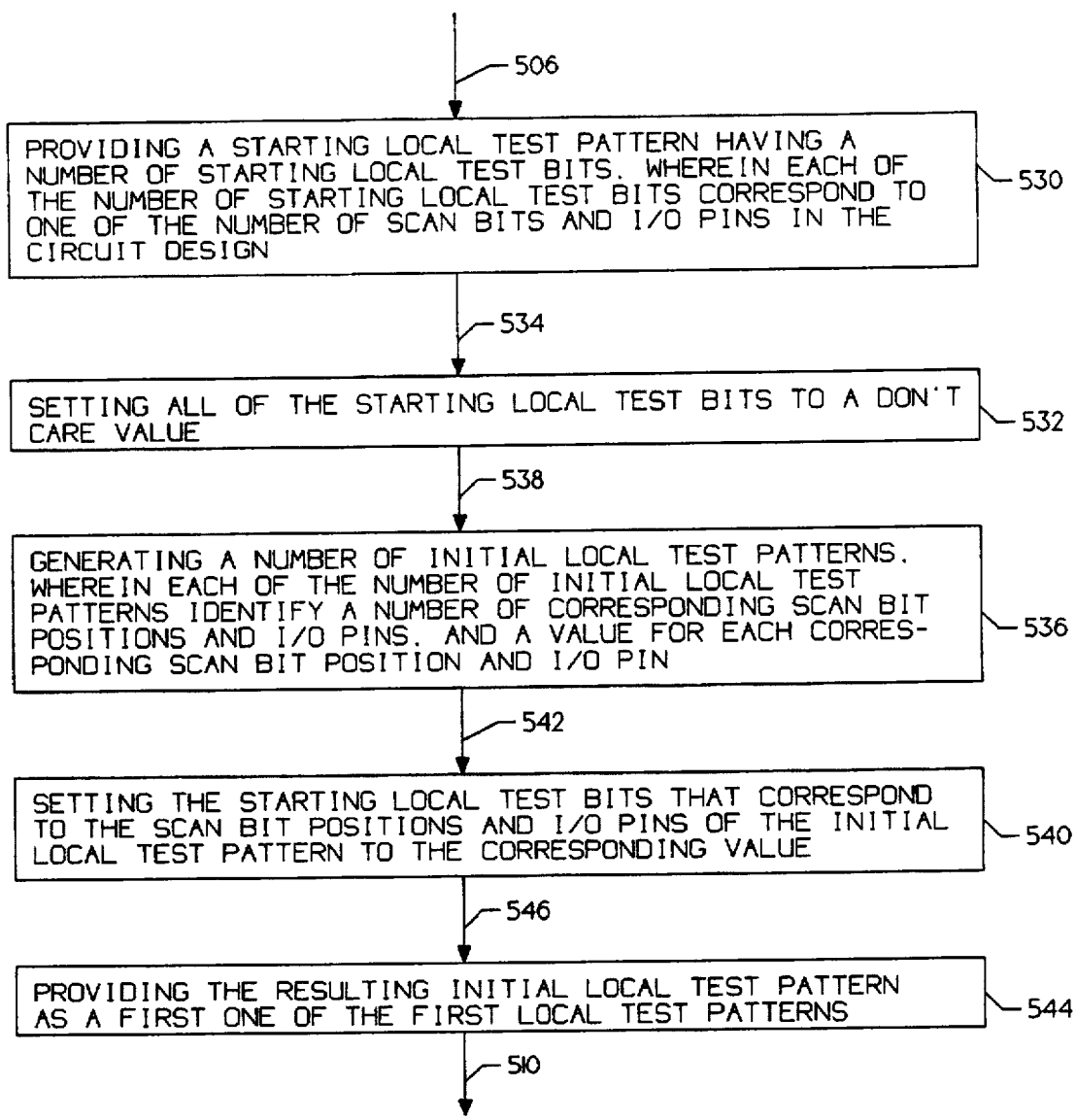
FIG. 14 is a flow diagram showing an illustrative method for performing the generating steps of FIG. 12A and FIG. 12B.

FIG. 14 is a flow diagram showing an illustrative method for performing the generating steps of FIG. 12A and FIG. 12B. In the illustrative embodiment, the generating step 504 of FIG. 12B may be supplemented by the steps shown in FIG. 14. In this embodiment, control may be passed from element 500 of FIG. 12A to element 530 via path 506. Element 530 provides a starting local test pattern having a number of local test bits, wherein each of the number of starting local test bits correspond to one of the number of scan bits and I/O pins in the circuit design. Control is then passed to element 532 via path 534. Element 532 sets all of the starting local test bits to a don't-care value. Control is then passed to element 536 via path 538. Element 536 generates a number of initial local test patterns, wherein each of the number of initial local test patterns identify a number of corresponding scan bit positions and I/O pins, and a value for each corresponding scan bit position and I/O pin. Control is then passed to element 540 via path 542. Element 540 sets the starting local test bits that correspond to the scan bit positions and I/O pins of the initial local test pattern to the corresponding value. Control is then passed to element 544 via path 546. Element 544 provides the resulting local test pattern as a first one of the first local test patterns. Control is then passed to element 508 of FIG. 12B via path 510.

Figure 15:
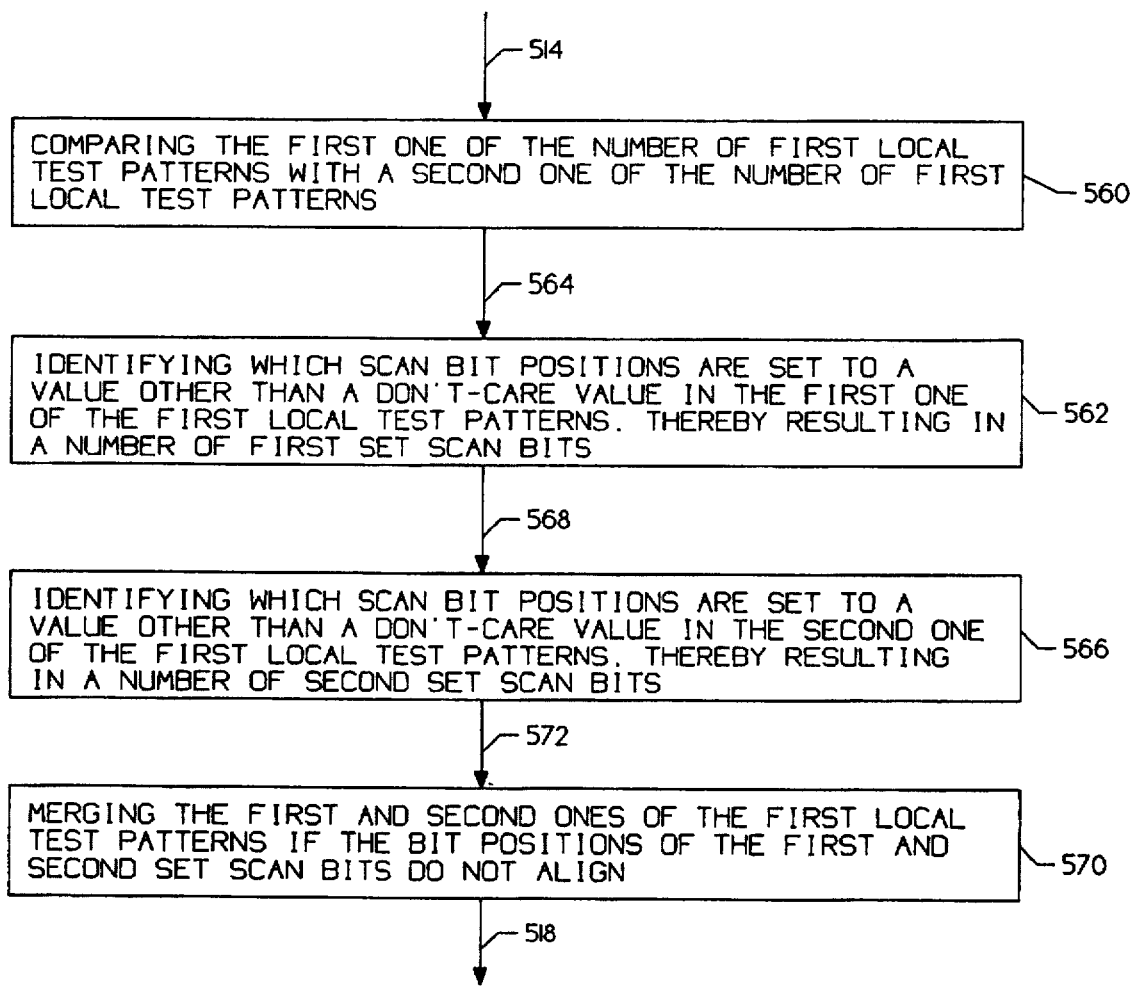
FIG. 15 is a flow diagram showing an illustrative method for performing the merging step of FIG. 12A and FIG. 12B.

FIG. 15 is a flow diagram showing an illustrative method for performing the merging step 512 of FIG. 12B. In this embodiment, control may be passed from element 508 of FIG. 12B to element 560 via path 514. Element 560 compares the first one of the number of first local test patterns with a second one of the number of first local test patterns. Control is then passed to element 562 via path 564. Element 562 identifies which scan bit positions are set to a value other than a don't-care value in the first one of the first local test patterns, thereby resulting in a number of first set scan bits. Control is then passed to element 566 via path 568. Element 566 identifies which scan bit positions are set to a value other than a don't-care value in the second one of the first local test patterns, thereby resulting in a number of second set scan bits. Control is then passed to element 570 via path 572. Element 570 merges the first and second ones of the first local test patterns if the bit positions of the first and second set scanned bits do not align. Control is then passed to element 516 of FIG. 12B via path 518, wherein the algorithm is exited.

Figure 16:
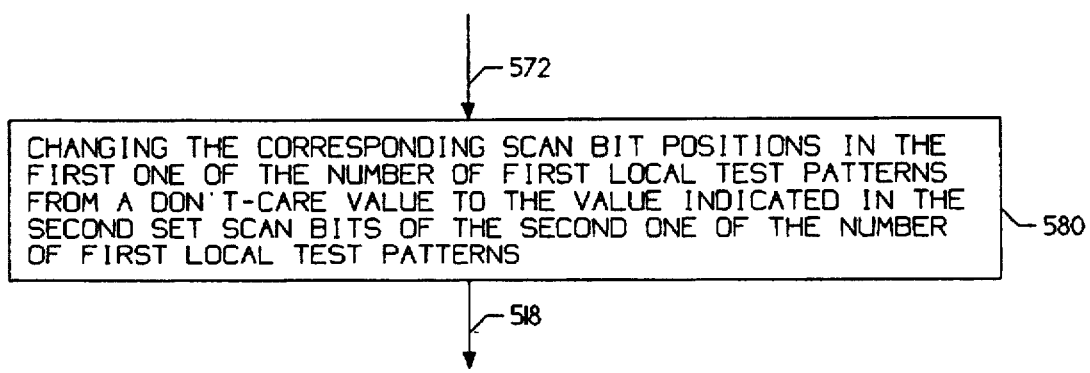
FIG. 16 is a flow diagram showing an illustrative method for performing the merging step of FIG. 15.

FIG. 16 is a flow diagram showing an illustrative method for performing the merging step 570 of FIG. 15. In this embodiment, control may be passed from element 566 of FIG. 15 to element 580. Element 580 changes the corresponding scanned bit positions in the first one of the number of first local test patterns from a don't-care value to the value indicated in the second set scanned bits of the second one of the number of first local test patterns or visa-versa. Control is then passed to element 516 of FIG. 12B via path 518.

Figure 17A:
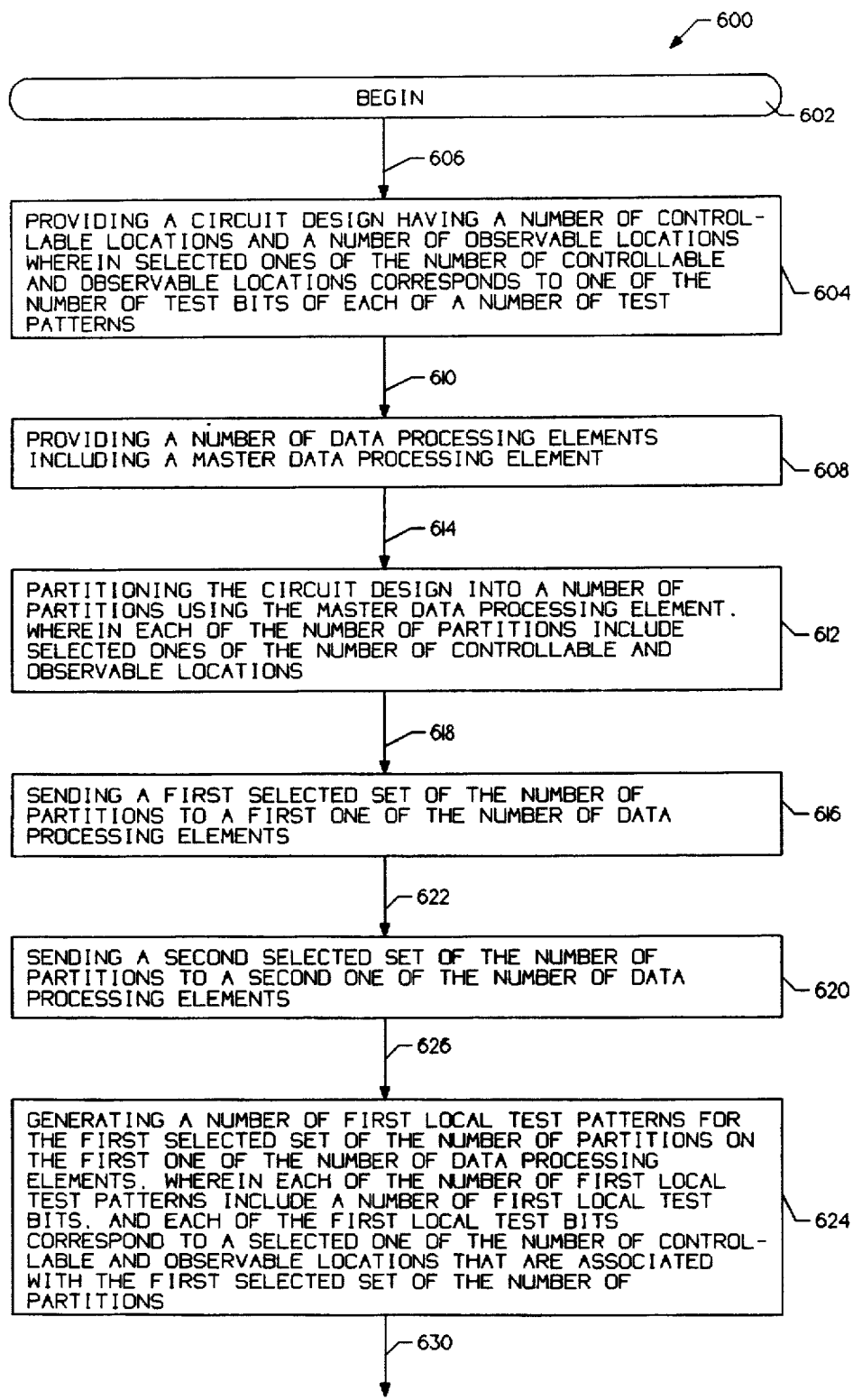
FIG. 17A and FIG. 17B depict a flow diagram showing a third exemplary method of the present invention.
Figure 17B:
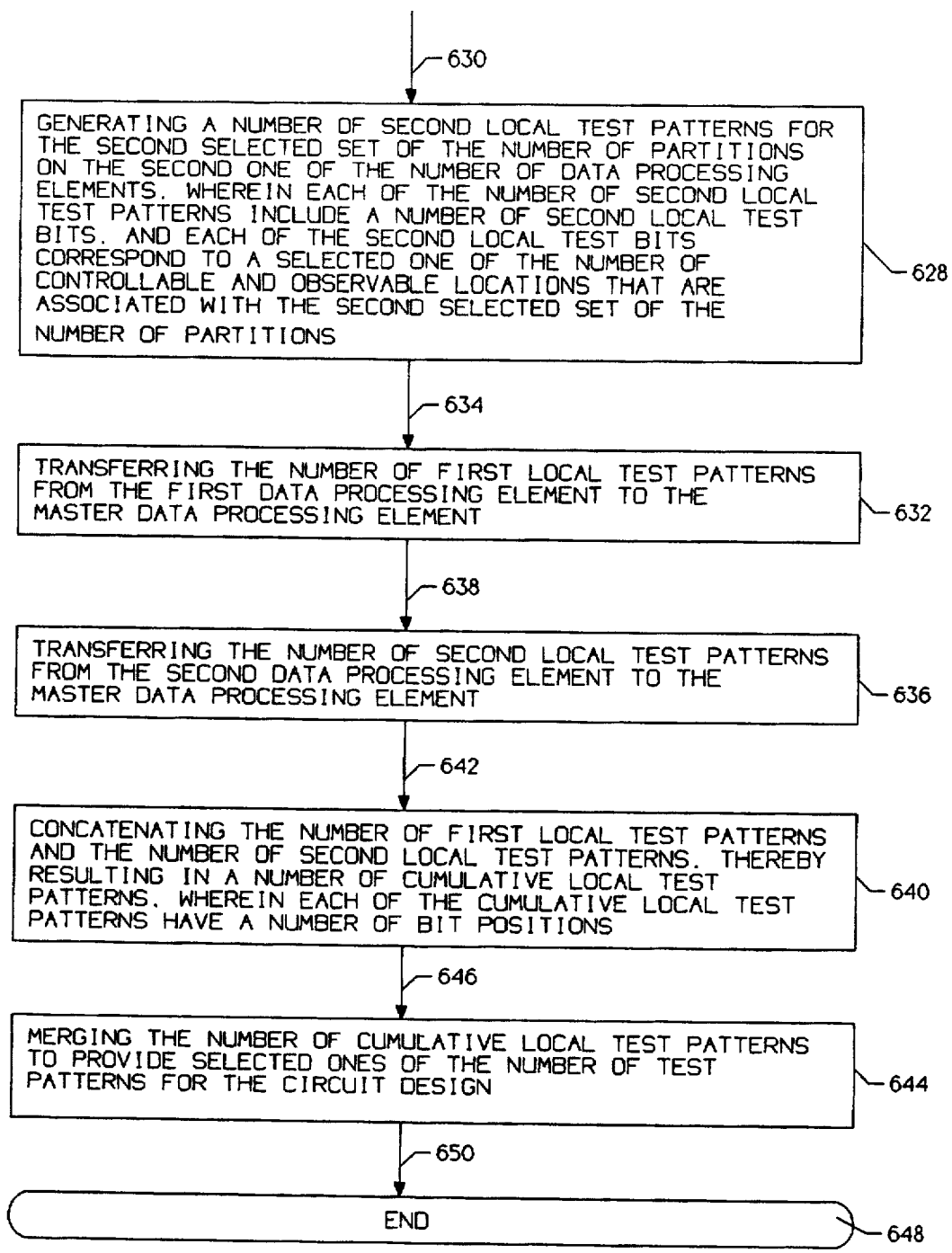

FIG. 17A and FIG. 17B depict a flow diagram showing a third exemplary method of the present invention. The algorithm is generally shown at 600 and is entered at element 602. Control is passed to element 604 via path 606. Element 604 provides a circuit design having a number of controllable locations and a number of observable locations, wherein selected ones of the number of controllable and observable locations correspond to one of the number of test bits of each of a number of test patterns. Control is then passed to element 608 via path 610. Element 608 provides a number of data processing elements, including a master data processing element. Control is then passed to element 612 via path 614.

Element 612 partitions the circuit design into a number of partitions using the master data processing element. Each of the number of partitions include selected ones of the number of controllable and observable locations. Control is passed to element 616 via path 618.

Element 616 sends a first selected set of the number of partitions to a first one of the number of data processing elements. Control is then passed to element 620 via path 622. Element 620 sends a second selected set of the number of partitions to a second one of the number of data processing elements. Control is then passed to element 624 via path 626.

Element 624 generates a number of first local test patterns for the first selected set of the number of partitions on the first one of the number of data processing elements. Each of the number of first local test patterns include a number of first local test bits, and each of the first local test bits correspond to a selected one of the number of controllable and observable locations that are associated with the first selected set of the number of partitions. Control is then passed to element 628 via path 630. Element 628 generates a number of second local test patterns for the second selected set of the number of partitions on the second one of the number of data processing elements. Each of the number of second local test patterns include a number of second local test bits, and each of the second local test bits correspond to a selected one of the number of controllable and observable locations that are associated with the second selected set of the number of partitions. Control is passed to element 632 via path 634.

Element 632 transfers the number of first local test patterns from the first data processing element to the master data processing element. Control is passed to element 636 via path 638. Element 636 transfers the number of second local test patterns from the second data processing element to the master data processing element. Control is passed to element 640 via path 642.

Element 640 concatenates the number of first local test patterns and the number of second local test patterns, thereby resulting in a number of cumulative local test patterns. Each of the cumulative local test patterns have a number of bit positions associated therewith. Control is passed to element 644 via path 646. Element 644 merges the number of cumulative local test patterns to provide selected ones of the number of test patterns for the circuit design. Control is then passed to element 648 via path 650, wherein the algorithm is exited.

Having thus described the preferred embodiments of the present invention, those of skill in the art will readily appreciate that the teachings found herein may be applied to yet other embodiments within the scope of the claims hereto attached.

What is claimed is:

1. A method for generating a number of test patterns for a circuit design, wherein each of the number of test patterns include a number of test bits, the circuit design having a number of controllable locations and a number of observable locations wherein selected ones of the number of controllable and observable locations corresponds to one of the number of test bits of each of the number of test patterns, the test patterns being generated on a number of data processing elements including a master data processing element, the method comprising the steps of:

a. partitioning the circuit design into a number of partitions using the master data processing element, wherein each of the number of partitions include selected ones of the number of controllable and observable locations;

b. sending a first selected set of the number of partitions to a first one of the number of data processing elements;

c. sending a second selected set of the number of partitions to a second one of the number of data processing elements;

d. generating a number of first local test patterns for the first selected set of the number of partitions on the first one of the number of data processing elements, wherein each of the number of first local test patterns include a number of first local test bits, and each of the first local test bits correspond to a selected one of the number of controllable and observable locations that are associated with the first selected set of the number of partitions;

e. generating a number of second local test patterns for the second selected set of the number of partitions on the second one of the number of data processing elements, wherein each of the number of second local test patterns include a number of second local test bits, and each of the second local test bits correspond to a selected one of the number of controllable and observable locations that are associated with the second selected set of the number of partitions; and f. merging the number of first local test patterns and the number of second local test patterns to provide selected ones of the number of test patterns for the circuit design.

2. A method according to claim 1 further comprising the steps of:

a. transferring the number of first local test patterns from the first data processing element to the master data processing element; and b. transferring the number of second local test patterns from the second data processing element to the master data processing element.

3. A method according to claim 2 wherein said merging step 1(f) is performed by the master data processing element once the transferring steps transfer the number of first local test patterns and the number of second local test patterns to the master data processing element.

4. A method according to claim 1 wherein said generating step 1(d) further includes the steps of:
   a. partitioning selected ones of the partitions in the first selected set of partitions into a number of first logic cones wherein each of the number of first logic cones include selected ones of the number of controllable and observable locations; and
   b. generating a number of first initial local test patterns for each of the number of first logic cones, wherein each of the number of first initial local test patterns include a number of first initial local test bits, wherein each of the number of first initial local test bits correspond to a selected one of the number of controllable and observable locations that are associated with the corresponding first logic cone.

5. A method according to claim 4 wherein the number of first initial local test patterns comprise selected ones of the number of first local test patterns.

6. A method according to claim 4 further comprising the step of:
   a. merging the number of first initial local test patterns that are generated for each of the number of first logic cones, thereby providing selected ones of the number of first local test patterns.

7. A method according to claim 1 wherein said generating step 1(d) includes an ATPG algorithm.

8. A method according to claim 7 wherein said ATPG algorithm is implemented as a software program that is executed on the first data processing element.

9. A method according to claim 4 wherein said generating step 1(e) further includes the steps of:
   a. partitioning selected ones of the partitions in the second selected set of partitions into a number of second logic cones wherein each of the number of second logic cones include selected ones of the number of controllable and observable locations; and
   b. generating a number of second initial local test patterns for each of the number of second logic cones, wherein each of the number of second initial local test patterns include a number of second initial local test bits, wherein each of the number of second initial local test bits correspond to a selected one of the number of controllable and observable locations that are associated with the corresponding second logic cone.

10. A method according to claim 9 wherein the number of second initial local test patterns comprise selected ones of the number of second local test patterns.

11. A method according to claim 10 further comprising the step of:
   a. merging the number of second initial local test patterns that are generated for each of the number of second logic cones, thereby providing selected ones of the number of second local test patterns.

12. A method according to claim 9 wherein said generating step 1(e) includes an ATPG algorithm.

13. A method according to claim 12 wherein said ATPG algorithm is implemented as a software program that is executed on the second data processing element.

14. A method according to claim 1 wherein each of the number of data processing elements operate autonomously.

15. A method according to claim 14 wherein each of the number of data processing elements are a separate engineering workstation.

16. A method according to claim 15 wherein each of the number of data processing elements are coupled together via a network.

17. A method according to claim 16 wherein said sending step 1(b) sends the first selected set of the number of partitions to the first one of the number of data processing elements via the network.

18. A method according to claim 16 wherein said sending step 1(c) sends the second selected set of the number of partitions to the second one of the number of data processing elements via the network.

19. A method for generating a number of test patterns for a circuit design, wherein each of the number of test patterns include a number of test bits, the circuit design having a number of scan paths therein wherein each of the number of scan paths have a number of scan bits associated therewith, and wherein selected ones of the number of scan bits corresponds to one of the number of test bits of each of the number of test patterns, the test patterns being generated on a number of data processing elements including a master data processing element, the method comprising the steps of:
   a. partitioning the circuit design into a number of partitions using the master data processing element, wherein each of the number of partitions include selected ones of the number of scan bits;
   b. sending a first selected set of the number of partitions to a first one of the number of data processing elements;
   c. sending a second selected set of the number of partitions to a second one of the number of data processing elements;
   d. generating a number of first local test patterns for the first selected set of the number of partitions on the first one of the number of data processing elements, wherein each of the number of first local test patterns include a number of first local test bits, and each of the first local test bits correspond to a selected one of the number of scan bits that are associated with the first selected set of the number of partitions;
   e. generating a number of second local test patterns for the second selected set of the number of partitions on the second one of the number of data processing elements, wherein each of the number of second local test patterns include a number of second local test bits, and each of the second local test bits correspond to a selected one of the number of scan bits that are associated with the second selected set of the number of partitions; and
   f. merging the number of first local test patterns and the number of second local test patterns to provide selected ones of the number of test patterns for the circuit design.

20. A method according to claim 19 further comprising the steps of:
   a. transferring the number of first local test patterns from the first data processing element to the master data processing element;
   b. transferring the number of second local test patterns from the second data processing element to the master data processing element.

21. A method according to claim 20 wherein said merging step 19(f) is performed by the master data processing element once the transferring steps transfer the number of first local test patterns and the number of second local test patterns to the master data processing element.

22. A method according to claim 19 wherein said sending step 19(b) also sends a master scan path and I/O list to the first one of the number of data processing elements, wherein the master scan path and I/O list identifies selected ones of the number of scan paths within the circuit design, and selected bit positions of each of the number of scan bits within the number of selected scan paths, the master scan path and I/O list also identifying selected I/O pins of the circuit design.

23. A method according to claim 22 wherein said generating step (d) generates each of the number of first local test patterns by performing the steps of:
   a. providing a starting local test pattern having a number of starting local test bits, wherein each of the number of starting local test bits correspond to one of the number of scan bits and I/O pins in the circuit design;
   b. setting selected ones of the starting local test bits to a don't-care value;
   c. generating a number of initial local test patterns, wherein each of the number of initial local test patterns identify a number of corresponding scan bit positions and I/O pins, and a value for each corresponding scan bit position and I/O pin;
   d. setting the starting local test bits that correspond to the scan bit positions and I/O pins of the initial local test pattern to the corresponding value; and
   e. providing the resulting starting local test pattern as a first one of the first local test patterns.

24. A method according to claim 23 further comprising the step of merging a first one of the number of first local test patterns with a second one of the number of first local test patterns by performing the steps of:
   a. comparing the first one of the number of first local test patterns with a second one of the number of first local test patterns;
   b. identifying which scan bit positions are set to a value other than a don't care value in the first one of the first local test patterns, thereby resulting in a number of first set scan bits;
   c. identifying which scan bit positions are set to a value other than a don't care value in the second one of the first local test patterns, thereby resulting in a number of second set scan bits; and
   d. merging the first and second ones of the first local test patterns if the bit positions of the first and second set scan bits do not align.

25. A method according to claim 24 wherein said merging step 24(d) includes the step of changing the corresponding scan bit positions in the first one of the number of first local test patterns from a don't care value to the value indicated in the second set scan bits of the second one of the number of first local test patterns.

26. A method according to claim 24 further comprising the step of merging the first and second ones of the first local test patterns if the first and second set scan bits are not inconsistent with each other.

27. A method for generating a number of test patterns for a circuit design, wherein each of the number of test patterns include a number of test bits, the circuit design having a number of controllable locations and a number of observable locations wherein selected ones of the number of controllable and observable locations corresponds to one of the number of test bits of each of the number of test patterns, the test patterns being generated on a number of data processing elements including a master data processing element, the method comprising the steps of:
   a. partitioning the circuit design into a number of partitions using the master data processing element, wherein each of the number of partitions include selected ones of the number of controllable and observable locations;
   b. sending a first selected set of the number of partitions to a first one of the number of data processing elements;
   c. sending a second selected set of the number of partitions to a second one of the number of data processing elements;
   d. generating a number of first local test patterns for the first selected set of the number of partitions on the first one of the number of data processing elements, wherein each of the number of first local test patterns include a number of first local test bits, and each of the first local test bits correspond to a selected one of the number of controllable and observable locations that are associated with the first selected set of the number of partitions;
   e. generating a number of second local test patterns for the second selected set of the number of partitions on the second one of the number of data processing elements, wherein each of the number of second local test patterns include a number of second local test bits, and each of the second local test bits correspond to a selected one of the number of controllable and observable locations that are associated with the second selected set of the number of partitions;
   f. transferring the number of first local test patterns from the first data processing element to the master data processing element;
   g. transferring the number of second local test patterns from the second data processing element to the master data processing element;
   h. concatenating the number of first local test patterns and the second number of local test patterns, thereby resulting in a number of cumulative local test patterns, wherein each of the cumulative local test patterns has a number of bit positions; and
   i. merging the number of cumulative local test patterns to provide selected ones of the number of test patterns for the circuit design.

28. A method according to claim 27 wherein the circuit design includes a number of scan paths, wherein each of the number of scan paths has a number of scan bit positions.

29. A method according to claim 28 wherein each of the cumulative local test patterns has a one-to-one correspondence to the scan bit positions of the number of scan paths.

30. A method according to claim 29 wherein only selected ones of the bit positions of the cumulative local test patterns are set to a value other than a don't-care value.

31. A method according to claim 27 wherein said merging step includes the steps of:
   a. comparing the first one of the number of cumulative local test patterns with a second one of the number of cumulative local test patterns;
   b. identifying which bit positions are set to a value other than a don't care value in the first one of the cumulative local test patterns, thereby resulting in a number of first set scan bits;
   c. identifying which bit positions are set to a value other than a don't care value in the second cumulative local test patterns, thereby resulting in a number of second set scan bits; and d. merging the first and second ones of the cumulative local test patterns if the bit positions of the first and second set scan bits do not align.

32. A method according to claim 31 wherein said merging step 33(d) includes the step of changing the corresponding bit positions in the first one of the cumulative local test patterns from a don't care value to the value indicated in the second set scan bits of the second one of the cumulative local test patterns.

33. A system for generating a number of test patterns for a circuit design, wherein each of the number of test patterns include a number of test bits, the circuit design having a number of controllable locations and a number of observable locations wherein selected ones of the number of controllable and observable locations corresponds to one of the number of test bits of each of the number of test patterns, the system comprising:

a. a number of data processing elements including a master data processing element;

b. a partitioning means located in the master data processing element for partitioning the circuit design into a number of partitions, wherein each of the number of partitions include selected ones of the number of controllable and observable locations;

c. sending means coupled to said partitioning means for sending a first selected set of the number of partitions to a first one of the number of data processing elements, and for sending a second selected set of the number of partitions to a second one of the number of data processing elements;

d. first generating means located in the first one of the number of data processing elements, for generating a number of first local test patterns for the first selected set of the number of partitions, wherein each of the number of first local test patterns include a number of first local test bits, and each of the first local test bits correspond to a selected one of the number of controllable and observable locations that are associated with the first selected set of the number of partitions;

e. second generating means located in the second one of the number of data processing elements, for generating a number of second local test patterns for the second selected set of the number of partitions, wherein each of the number of second local test patterns include a number of second local test bits, and each of the second local test bits correspond to a selected one of the number of controllable and observable locations that are associated with the second selected set of the number of partitions; and f. merging means located in master data processing element for merging the number of first local test patterns and the number of second local test patterns to provide selected ones of the number of test patterns for the circuit design.

34. A system according to claim 33 further comprising:

a. first transferring means coupled to the first data processing element, for transferring the number of first local test patterns from the first data processing element to the master data processing element; and b. second transferring means coupled to the second data processing element for transferring the number of second local test patterns from the second data processing element to the master data processing element.

35. A system according to claim 34 further comprising a first local merging means located in the first data processing element for merging selected ones of the number of first local test patterns, thereby resulting in a reduced set of first local test patterns.

36. A system according to claim 35 wherein said first transferring means transfers the reduced set of first local test patterns from the first data processing element to the master data processing element.

37. A system according to claim 36 further comprising a second local merging means located in the second data processing element for merging selected ones of the number of second local test patterns, thereby resulting in a reduced set of second local test patterns.

38. A system according to claim 37 wherein said second transferring means transfers the reduced set of second local test patterns from the second data processing element to the master data processing element.

* * * * *